US012751271B2

(12) United States Patent
Yeoh et al.

(10) Patent No.: US 12,751,271 B2
(45) Date of Patent: Sep. 29, 2026

(54) GATE ALL AROUND BACKSIDE POWER RAIL WITH DIFFUSION BREAK

(71) Applicant: Applied Materials, Inc., Santa Clara, CA (US)

(72) Inventors: Andrew Yeoh, Portland, OR (US); Benjamin Colombeau, San Jose, CA (US); Balasubramanian Pranatharthiharan, San Jose, CA (US); El Mehdi Bazizi, San Jose, CA (US); Ashish Pal, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 607 days.

(21) Appl. No.: 18/106,643

(22) Filed: Feb. 7, 2023

(65) Prior Publication Data

US 2023/0260909 A1 Aug. 17, 2023

Related U.S. Application Data

(60) Provisional application No. 63/311,104, filed on Feb. 17, 2022.

(51) Int. Cl.

*H10W 20/41* (2026.01)
*H10D 30/01* (2025.01)

(Continued)

(52) U.S. Cl.

CPC ........ *H10W 20/427* (2026.01); *H10D 30/014* (2025.01); *H10D 30/43* (2025.01); *H10D 30/6729* (2025.01); *H10D 30/6735* (2025.01); *H10D 62/121* (2025.01); *H10D 64/01* (2025.01); *H10P 14/3411* (2026.01); *H10P 14/3462* (2026.01)

(58) Field of Classification Search

CPC .......... H01L 23/5286; H01L 21/02603; H10D 30/6735; H10D 62/121; H10D 64/254

See application file for complete search history.

(56) References Cited

U.S. PATENT DOCUMENTS 10,985,161 B2 4/2021 Xu et al.
11,121,023 B2 9/2021 Shu et al.

(Continued)

FOREIGN PATENT DOCUMENTS

CN 113206062 A 8/2021

OTHER PUBLICATIONS

Miyaguchi, K. , et al., "Single and Double Diffusion Breaks in 14nm FinFET and Beyond", Extended Abstracts of the 2017 International Conference on Solid State Devices and Materials, Sendai, 2017, pp. 219-220.

(Continued)

*Primary Examiner* — Brian Turner

(74) *Attorney, Agent, or Firm* — SERVILLA WHITNEY LLC

(57) ABSTRACT

Semiconductor devices and methods of manufacturing the same are described. The method includes forming a diffusion break opening on the backside and filling with a diffusion break material to serve as a planarization stop. In some embodiments, a single diffusion break opening is formed. In other embodiments, a mixed diffusion break opening is formed.

18 Claims, 34 Drawing Sheets

100

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10P 14/20*** | (2026.01) |

(56) References Cited

U.S. PATENT DOCUMENTS

| | | | | |
|---|---|---|---|---|
| 2017/0141211 | A1 | 5/2017 | Xie et al. | |
| 2018/0053690 | A1* | 2/2018 | Wang | H10D 84/014 |
| 2020/0090982 | A1* | 3/2020 | Sung | H01L 21/3065 |
| 2020/0119004 | A1 | 4/2020 | Ching et al. | |
| 2020/0303500 | A1 | 9/2020 | Loubet et al. | |
| 2020/0343144 | A1* | 10/2020 | Li | H10D 84/834 |
| 2021/0288046 | A1* | 9/2021 | Reznicek | H10D 1/714 |
| 2021/0296318 | A1* | 9/2021 | Wang | H10D 62/121 |
| 2021/0375685 | A1 | 12/2021 | Xie et al. | |
| 2021/0376093 | A1* | 12/2021 | Chu | H10D 62/121 |
| 2021/0408246 | A1 | 12/2021 | Ganguly et al. | |
| 2022/0359699 | A1* | 11/2022 | Chou | H10D 30/43 |

OTHER PUBLICATIONS

PCT International Search Report and Written Opinion in PCT/US2023/013133 dated Jun. 5, 2023, 9 pages.

* cited by examiner

GATE ALL AROUND BACKSIDE POWER RAIL WITH DIFFUSION BREAK

CROSS-REFERENCE TO RELATED APPLICATIONS

This application claims priority to U.S. Provisional Application No. 63/311,104, filed Feb. 17, 2022, the entire disclosure of which is hereby incorporated by reference herein.

TECHNICAL FIELD

Embodiments of the disclosure generally relate to semiconductor devices. More particularly, embodiments of the disclosure are directed to gate-all-around (GAA) devices including a diffusion break material as a planarization stop for GAA backside power rail formation.

BACKGROUND

The transistor is a key component of most integrated circuits. Since the drive current, and therefore speed, of a transistor is proportional to the gate width of the transistor, faster transistors generally require larger gate width. Thus, there is a trade-off between transistor size and speed, and “fin” field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor and are now being applied in many integrated circuits. However, finFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a gate all around (GAA) structure. The GAA device structure includes several lattice matched channels suspended in a stacked configuration and connected by source/drain regions. The GAA structure provides good electrostatic control and can find broad adoption in complementary metal oxide semiconductor (CMOS) wafer manufacturing.

Connecting semiconductors to a power rail is typically done on the front of the cell, which requires significant cell area. For backside power rail formation, the wafer thickness is reduced after front-side processing using a chemical mechanical planarization (CMP) process without an etch stop layer. This leads to problems of over-polishing and several wafer thickness characterizations during the CMP. For backside power rail formation, a via-etch is performed through the silicon from the backside of the wafer to get access to source-epi. This process does not have an etch-stop layer, which leads to over-etching, resulting in shorts, or it leads to under-etching, resulting in open. Accordingly, there is a need for improved semiconductor devices and methods of manufacture.

SUMMARY

One or more embodiments of the disclosure are directed to methods of forming a semiconductor device. In one or more embodiments, a method of forming a semiconductor device comprises: forming a gate structure on a superlattice structure, the superlattice structure on a shallow trench isolation on a substrate, the superlattice structure comprising a plurality of horizontal channel layers and a corresponding plurality of semiconductor material layers alternatingly arranged in a plurality of stacked pairs; forming a plurality of source trenches and a plurality of drain trenches adjacent to the superlattice structure on the substrate; depositing a bottom dielectric isolation layer in the plurality of source trenches and a plurality of drain trenches; forming a resist on the gate structure; patterning the resist to form a diffusion break opening; depositing a diffusion break material in the diffusion break opening; planarizing the device; etching to form a plurality of via openings extending to the bottom dielectric isolation layer; and depositing a metal in the plurality of via openings and in the opening to form a plurality of vias.

Additional embodiments of the disclosure are directed to methods of forming a semiconductor device. In one or more embodiments, a method of forming a semiconductor device comprises: forming a plurality of source trenches and a plurality of drain trenches adjacent to a superlattice structure on a substrate, the superlattice structure comprising a plurality of horizontal channel layers and a corresponding plurality of semiconductor material layers alternatingly arranged in a plurality of stacked pairs; forming a gate structure on a top surface of the superlattice structure; expanding at least one of the plurality of source trenches and at least one of the plurality of drain trenches to form a source cavity and a drain cavity; depositing a bottom isolation dielectric layer in the source cavity and in the drain cavity; forming a resist on a gate structure; patterning the resist to form at least one diffusion break opening; depositing a diffusion break material in the at least one diffusion break opening; rotating the semiconductor device 180 degrees; planarizing the semiconductor device; forming a backside power rail via in the substrate to the bottom dielectric isolation layer; and depositing a metal in the backside power rail via.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1A:
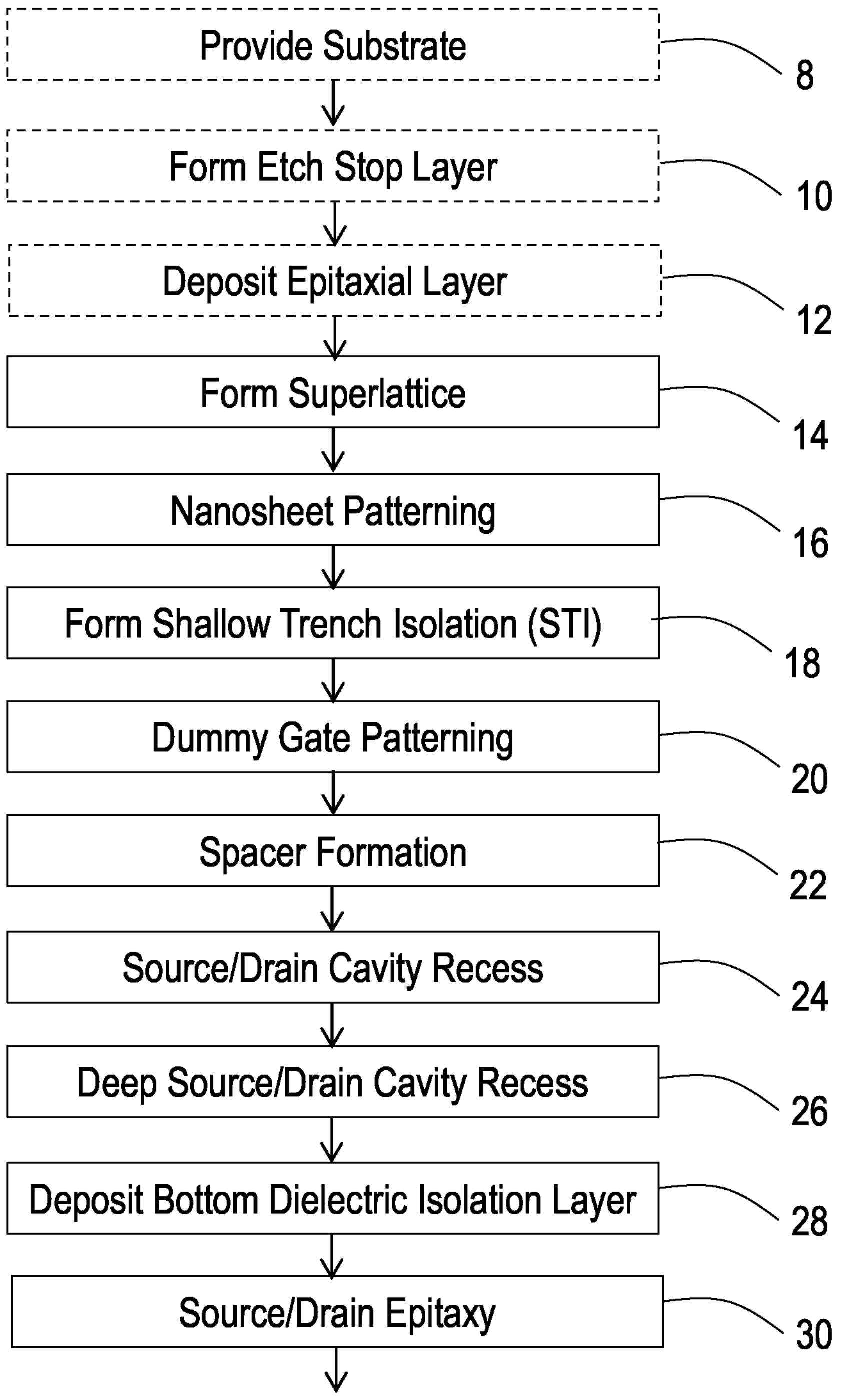
FIG. 1A is a process flow diagram of a method according to one or more embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

As used in this specification and the appended claims, the terms "precursor," "reactant," "reactive gas" and the like are used interchangeably to refer to any gaseous species that can react with the substrate surface.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Enhancement mode field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated $I_S$ and current entering the channel at the drain (D) is designated $I_D$. Drain-to-source voltage is designated $V_{DS}$. By applying voltage to gate (G), the current entering the channel at the drain (i.e., $I_D$) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is an n region. The source is so named because it is the source of the charge carriers (electrons for n-channel, holes for p-channel) that flow through the channel; similarly, the drain is where the charge carriers leave the channel.

As used herein, the term "fin field-effect transistor (FinFET)" refers to a MOSFET transistor built on a substrate where the gate is placed on two or three sides of the channel, forming a double- or triple-gate structure. FinFET devices have been given the generic name FinFETs because the channel region forms a "fin" on the substrate. FinFET devices have fast switching times and high current density.

As used herein, the term "gate all-around (GAA)," is used to refer to an electronic device, e.g., a transistor, in which the gate material surrounds the channel region on all sides. The channel region of a GAA transistor may include nanowires or nano-slabs or nano-sheets, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

As used herein, the term "nanowire" refers to a nanostructure, with a diameter on the order of a nanometer ($10^{-9}$ meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g., DRAM) and non-volatile (e.g., NAND) devices. As used herein, the term "nanosheet" refers to a two-dimensional nanostructure with a thickness in a scale ranging from about 0.1 nm to about 1000 nm.

The embodiments of the disclosure are described by way of the Figures, which illustrate devices (e.g., transistors) and processes for forming transistors in accordance with one or more embodiments of the disclosure. The processes shown are merely illustrative possible uses for the disclosed processes, and the skilled artisan will recognize that the disclosed processes are not limited to the illustrated applications.

One or more embodiments of the disclosure are described with reference to the Figures. In the method of one or more embodiments, transistors, e.g., gate all-around transistors, are fabricated using a standard process flow. In some embodiments, a diffusion break fill is used as a planarization stop layer for backside wafer polishing to realize a backside power rail. In one or more embodiments, the diffusion break fill material works as an effective etch stop layer for the backside wafer polish process, connecting the bottom of NMOS and PMOS source-epi. As a result, the height and aspect ratio of BPR-via is reduced, which helps in BPR-via etch and fill process.

In the method of one or more embodiments, transistors, e.g., gate all-around transistors, are fabricated using a standard process flow, as illustrated in FIGS. 2A through 2H. Fabrication proceeds with formation of the inner spacer, source/drain epitaxy, formation of an interlayer dielectric. A resist in then deposited and patterned, followed by deposition of a diffusion break material. Fabrication then proceeds with formation of the replacement metal gate, CT, V0, M0, $M_xV_x$, and the like. The substrate is then flipped and planarized, the planarization stopping on the diffusion break fill material. The backside power rail vias are then patterned. In some embodiments, the diffusion break is a single diffusion break. In other embodiments, the diffusion break is a mixed diffusion break.

In one or more embodiments, the term "diffusion break" refers to an isolation material disposed between two active regions. As used herein, "double diffusion break (DDB)" refers to an isolation structure having a lateral width between two active regions which approximately corresponds to the lateral width of source and drain structures of a FET device, e.g., such as a GAA device. As used herein, the term "single diffusion break (SDB)" refers to an isolation structure having a lateral width between two active regions that is less than the lateral width of a gate structure of a FET device. As used herein, the term "mixed diffusion break (MDB)" refers to the combined usage of SDB and DDB at different locations of a wafer in a process flow.

Figure 1B:
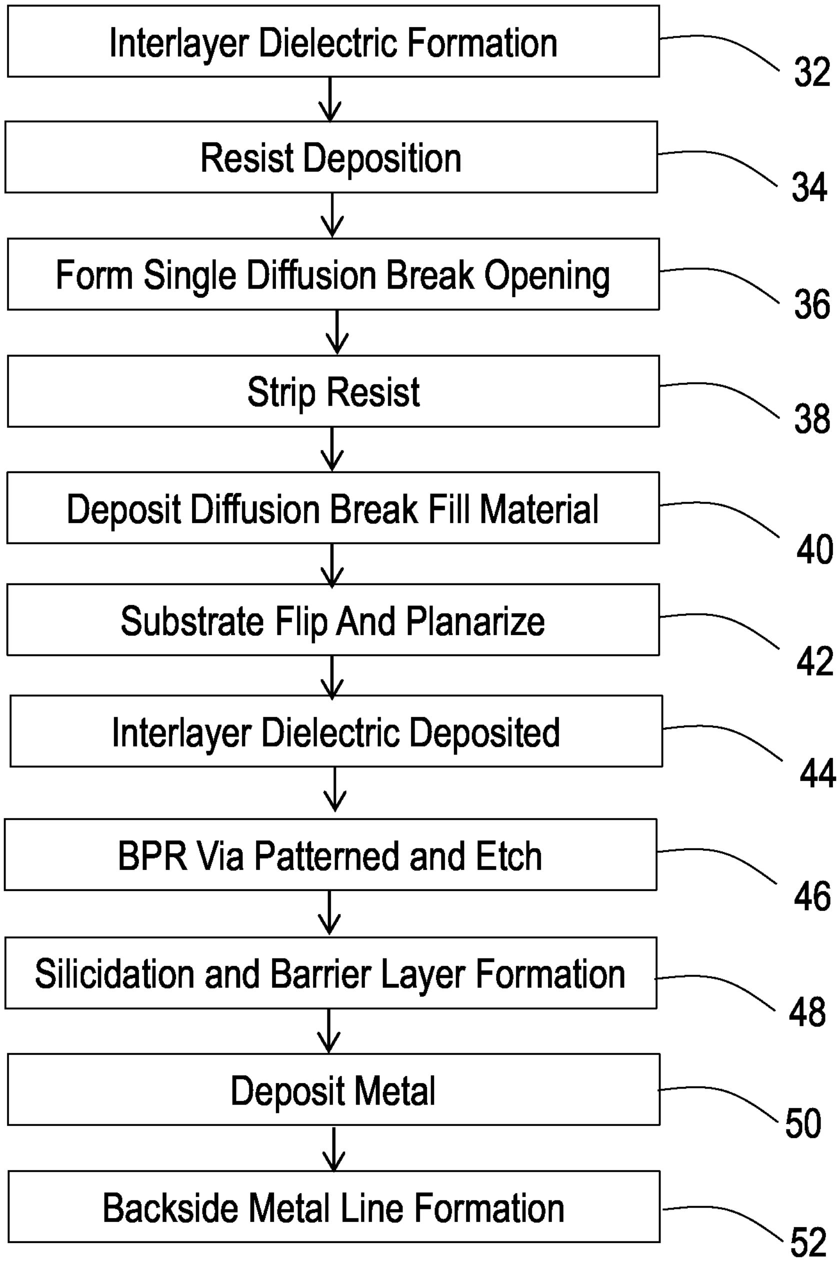
FIG. 1B is a process flow diagram of a method according to one or more embodiments.
Figure 1C:
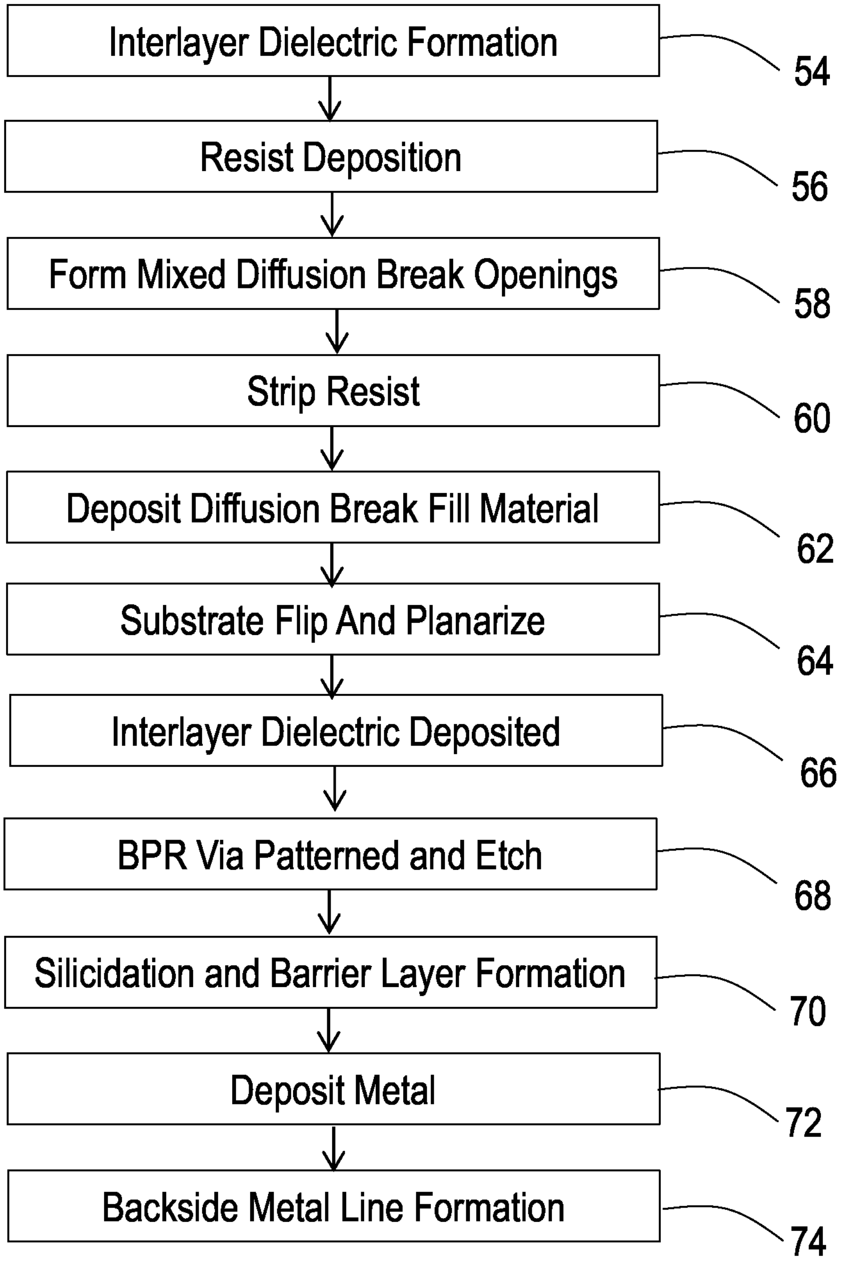
FIG. 1C is a process flow diagram of a method according to one or more embodiments.

FIG. 1A illustrates the standard process flow diagram for a method 6A for forming a semiconductor device in accordance with some embodiments of the present disclosure. FIGS. 2A-2H depict the stages of fabrication of semiconductor structures in accordance with the standard process flow of FIG. 1A. FIG. 1B illustrates a process flow diagram for a method 6B for forming a semiconductor device in accordance with some embodiments of the present disclosure, where a single diffusion break is used. FIGS. 3A-3J depict the stages of fabrication of semiconductor structures in accordance with FIG. 1B, where a single diffusion break is used. FIG. 1C illustrates a process flow diagram for a method 6C for forming a semiconductor device in accordance with some embodiments of the present disclosure, where a mixed diffusion break is used. FIGS. 4A-4J depict the stages of fabrication of semiconductor structures in accordance with FIG. 1C, where a mixed diffusion break is used.

The methods 6A, 6B, and 6C are described below with respect to FIGS. 2A-2H, FIGS. 3A-3J, and FIGS. 4A-4J. FIGS. 2A-2H, FIGS. 3A-3J, and FIGS. 4A-4J are cross-sectional views of an electronic device (e.g., a GAA) according to one or more embodiments. The methods 6A, 6B, and 6C may be part of a multi-step fabrication process of a semiconductor device. In one or more embodiments, the methods 6A, 6B, and 6C may be performed in a processing chamber without breaking vacuum. Accordingly, the methods 6A, 6B, and 6C may be performed in any suitable process chamber coupled to a cluster tool. The cluster tool may include process chambers for fabricating a semiconductor device, such as chambers configured for etching, deposition, physical vapor deposition (PVD), chemical vapor deposition (CVD), oxidation, or any other suitable chamber used for the fabrication of a semiconductor device.

FIGS. 2A-2I are the fabrication steps of operations 8 through 30 in FIG. 1A. Referring to FIG. 1A, the method 6A of forming the device 100 begins at operation 8, by providing a substrate 102. In some embodiments, the substrate 102 may be a bulk semiconductor substrate. As used herein, the term "bulk semiconductor substrate" refers to a substrate in which the entirety of the substrate is comprised of a semiconductor material. The bulk semiconductor substrate may comprise any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon wafers, patterned or non-patterned wafers, doped silicon, germanium, gallium arsenide, or other suitable semiconducting materials. In some embodiments, the semiconductor material is silicon (Si). In one or more embodiments, the semiconductor substrate 102 comprises a semiconductor material, e.g., silicon (Si), carbon (C), germanium (Ge), silicon germanium (SiGe), germanium tin (GeSn), other semiconductor materials, or any combination thereof. In one or more embodiments, the substrate 102 comprises one or more of silicon (Si), germanium (Ge), gallium (Ga), arsenic (As), or phosphorus (P). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, the semiconductor material may be a doped material, such as n-doped silicon (n-Si), or p-doped silicon (p-Si). In some embodiments, the substrate may be doped using any suitable process such as an ion implantation process. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers. In one or more embodiments, the dopant is selected from one or more of boron (B), gallium (Ga), phosphorus (P), arsenic (As), other semiconductor dopants, or combinations thereof.

Figure 2A:
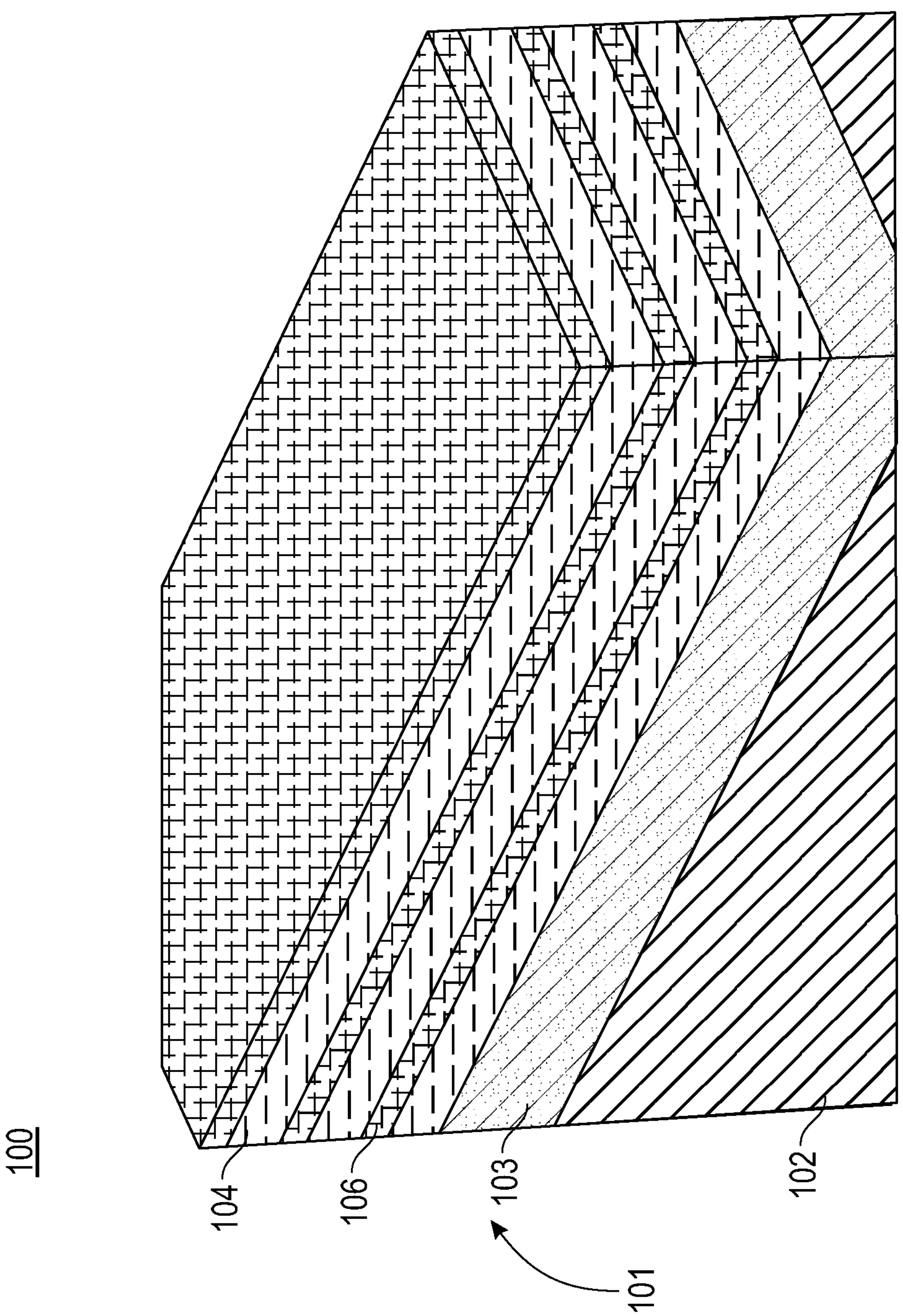
FIGS. 2A-2J illustrate cross-section views of a device according to the method of one or more embodiments.

With reference to FIGS. 1A and 2A, in some embodiments, at operation 10, an etch stop layer 103 may be formed on a top surface of the substrate. The etch stop layer 103 may comprise any suitable material known to the skilled artisan. In one or more embodiments, the etch stop layer 103 comprises silicon germanium (SiGe). In one or more embodiments, the etch stop layer 103 has a high germanium (Ge) content. In one or more embodiments, the amount of germanium is in a range of from 30% to 50%, including a range of from 35% to 45%. Without intending to be bound by theory, it is thought that the germanium content being in a range of from 30% to 50% leads to increased selectivity of the etch stop layer and minimizes stress defects. In one or more embodiments, the etch stop layer has a thickness in a range of from 5 nm to 30 nm. The etch stop layer 103 may serve as an etch stop for planarization (e.g., CMP), dry or wet etch during backside processing.

In one or more unillustrated embodiments, at operation 12, an epitaxial layer, e.g., epitaxial silicon, may be deposited on the etch stop layer 103. The epitaxial layer may have a thickness is a range of from 20 nm to 100 nm.

Referring to FIG. 1A and FIG. 2A, in one or more embodiments, at operation 14, at least one superlattice structure 101 is formed atop the top surface of the substrate 102 or on a top surface of the etch stop layer 103 and epitaxial layer. The superlattice structure 101 comprises a plurality of semiconductor material layers 104 and a corresponding plurality of horizontal channel layers 106 alternatingly arranged in a plurality of stacked pairs. In some embodiments the plurality of stacked groups of layers comprises a silicon (Si) and silicon germanium (SiGe) group. In some embodiments, the plurality of semiconductor material layers 104 comprise silicon germanium (SiGe), and the plurality of horizontal channel layers 106 comprise silicon (Si). In other embodiments, the plurality of horizontal channel layers 106 comprise silicon germanium (SiGe), and the plurality of semiconductor materials layers 106 comprise silicon (Si).

In some embodiments, the plurality of semiconductor material layers 104 and corresponding plurality of horizontal channel layers 106 can comprise any number of lattice matched material pairs suitable for forming a superlattice structure 204. In some embodiments, the plurality of semiconductor material layers 104 and corresponding plurality of horizontal channel layers 106 comprise from about 2 to about 50 pairs of lattice matched materials.

In one or more embodiments, the thickness of the plurality of semiconductor material layers 104 and the plurality of horizontal channel layers 106 are in the range of from about 2 nm to about 50 nm, in the range of from about 3 nm to about 20 nm, or in a range of from about 2 nm to about 15 nm.

Figure 2B:
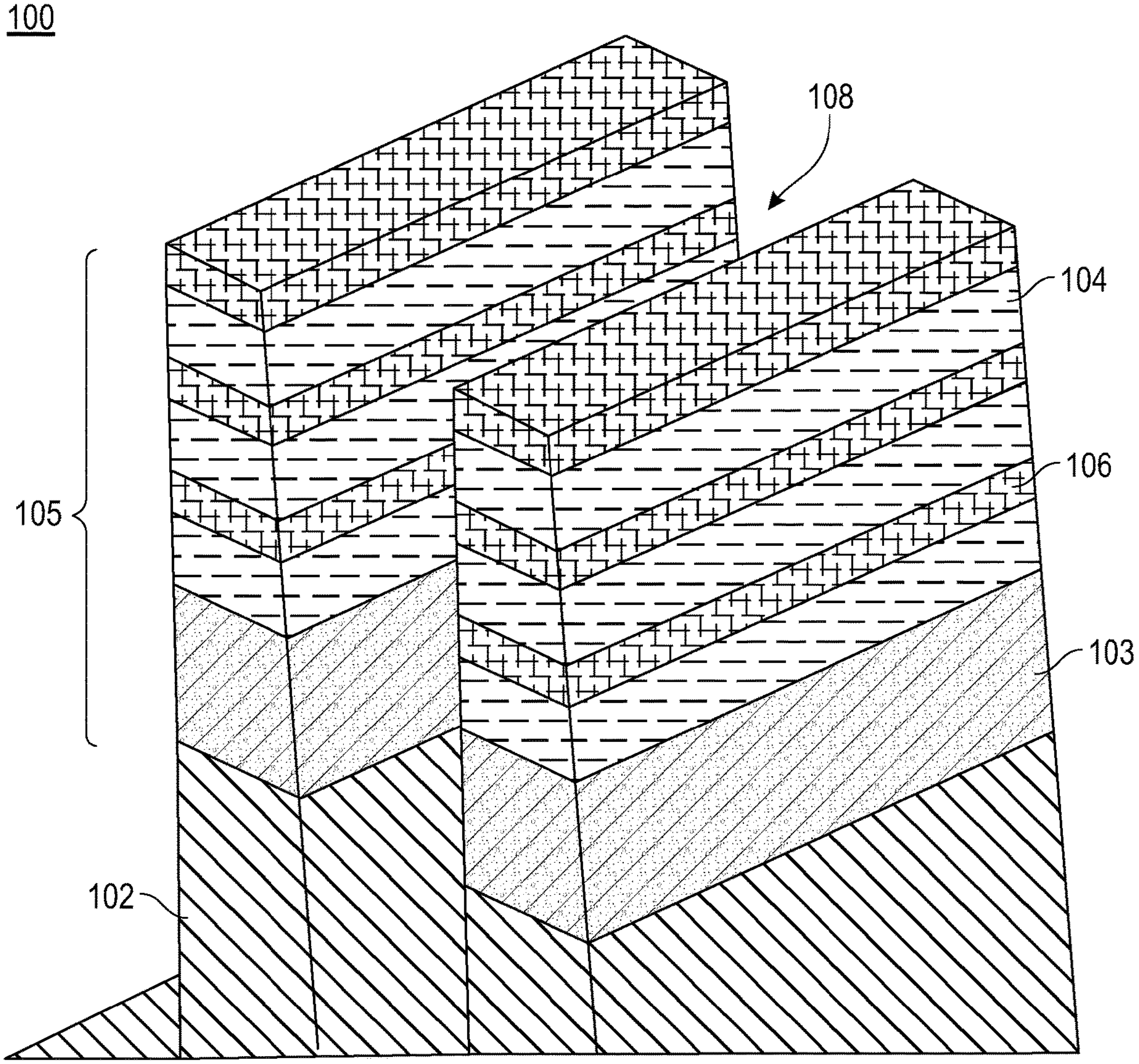

With reference to FIG. 1A and FIG. 2B, in one or more embodiments, at operation 16, the superlattice structure 101 is patterned to form an opening 108 between adjacent stacks 105. The patterning may be done by any suitable means known to the skilled artisan. As used in this regard, the term "opening" means any intentional surface irregularity. Suitable examples of openings include, but are not limited to, trenches which have a top, two sidewalls and a bottom. Openings can have any suitable aspect ratio (ratio of the depth of the feature to the width of the feature). In some embodiments, the aspect ratio is greater than or equal to about 5:1, about 10:1, about 15:1, about 20:1, about 25:1, about 30:1, about 35:1 or about 40:1.

Figure 2C:
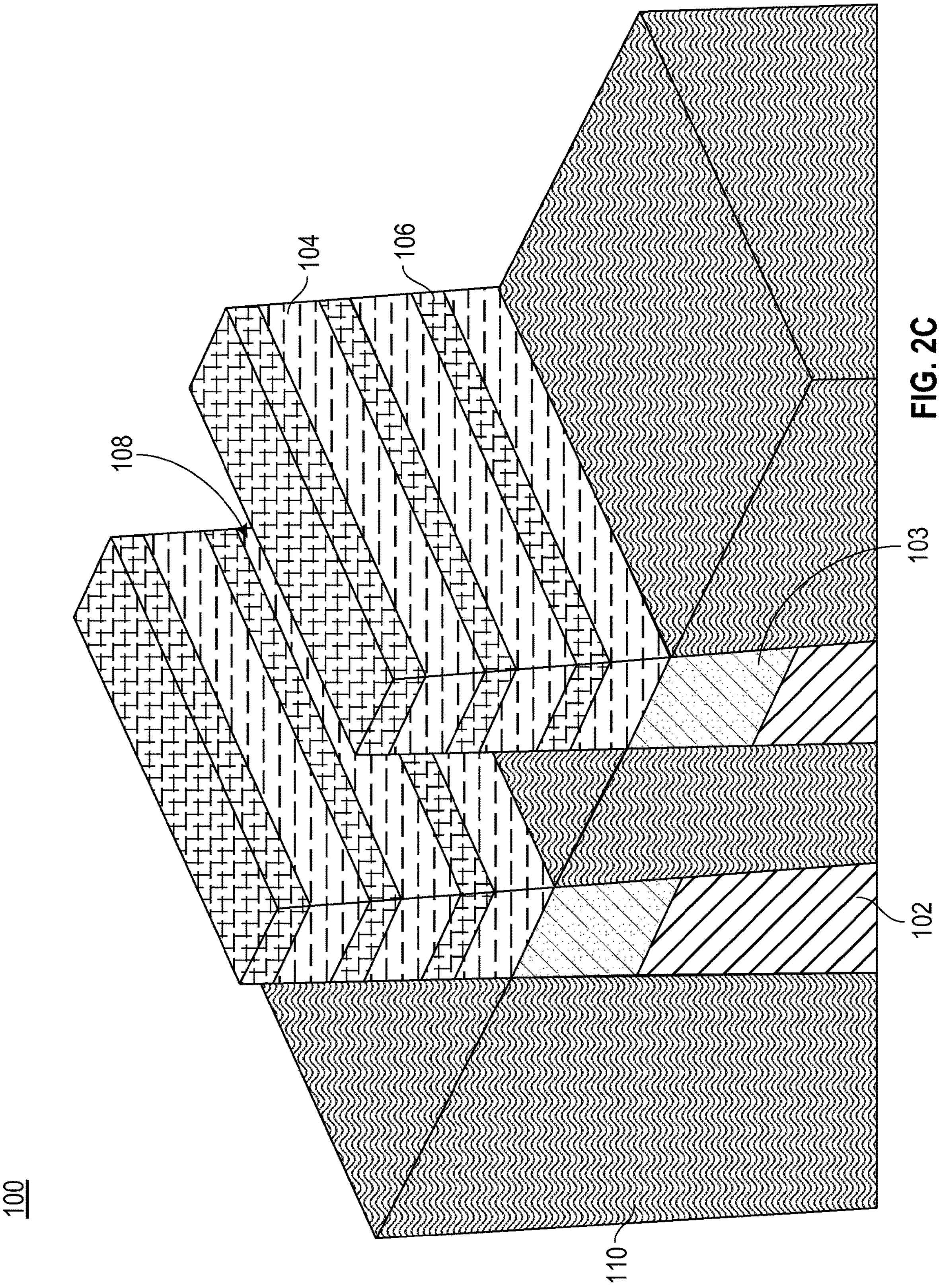

Referring to FIG. 1A and FIG. 2C, at operation 18, a shallow trench isolation (STI) 110 is formed. As used herein, the term "shallow trench isolation (STI)" refers to an integrated circuit feature which prevents current leakage. In one or more embodiments, STI is created by depositing one or more dielectric materials (such as silicon dioxide) to fill the trench or opening 108 and removing the excess dielectric using a technique such as chemical-mechanical planarization.

Figure 2D:
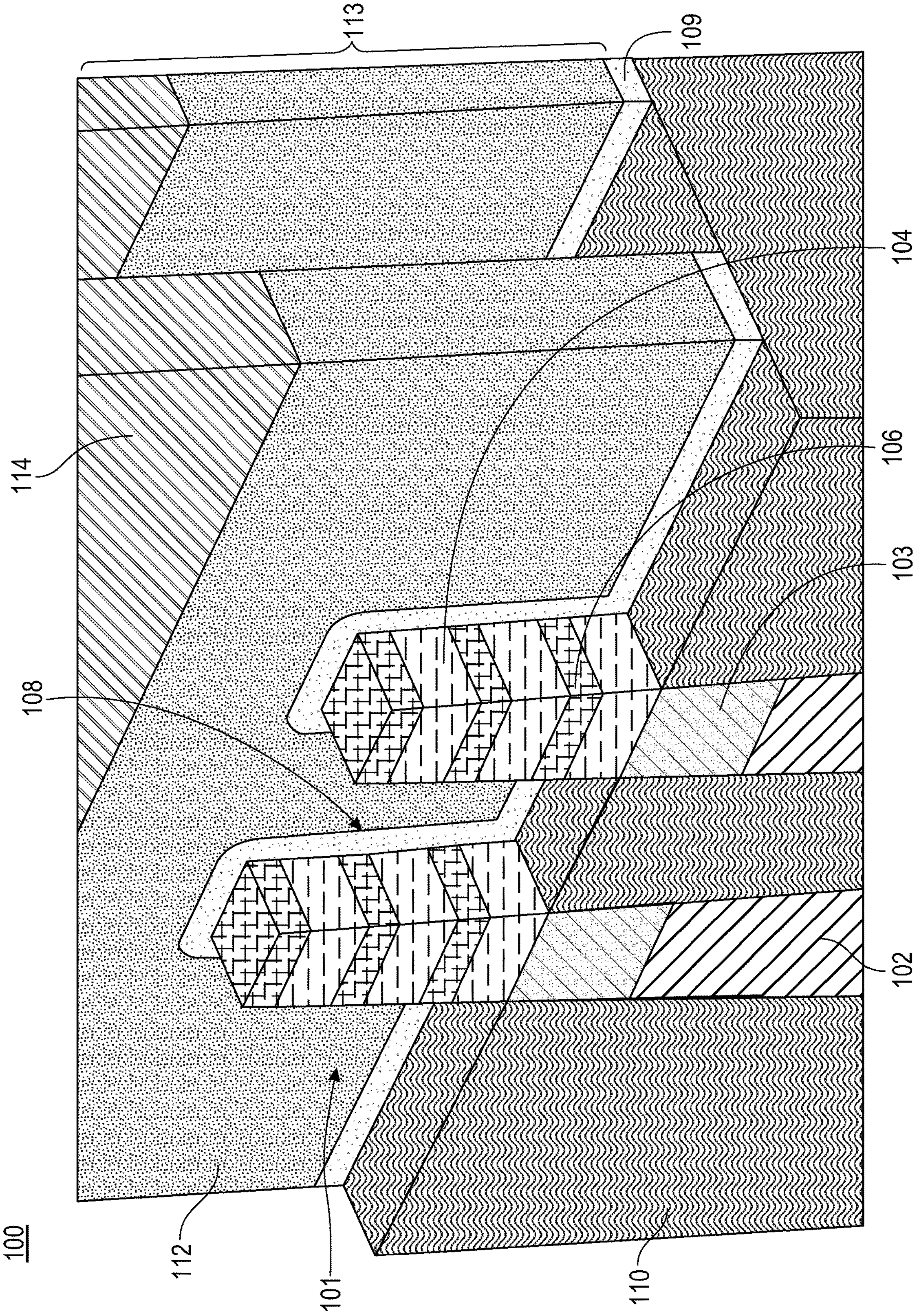

With reference to FIG. 1A and FIG. 2D, in some embodiments, a dummy gate structure 113 is formed over and adjacent to the superlattice structure 101. The dummy gate structure 113 defines the channel region of the transistor device. The dummy gate structure 113 may be formed using any suitable conventional deposition and patterning process known in the art.

In one or more embodiments, the dummy gate structure 113 comprises one or more of a gate material 114 and a poly-silicon layer 112. In some embodiments, the dummy gate structure 113 may also include a dielectric layer 109 between the superlattice structure and the poly-silicon layer 112. In one or more embodiments, the dummy gate structure 113 comprises one or more of tungsten (W), cobalt (Co), molybdenum (Mo), ruthenium (Ru), titanium nitride (TiN), tantalum nitride (TaN), titanium aluminum (TiAl), and n-doped polysilicon.

Figure 2E:
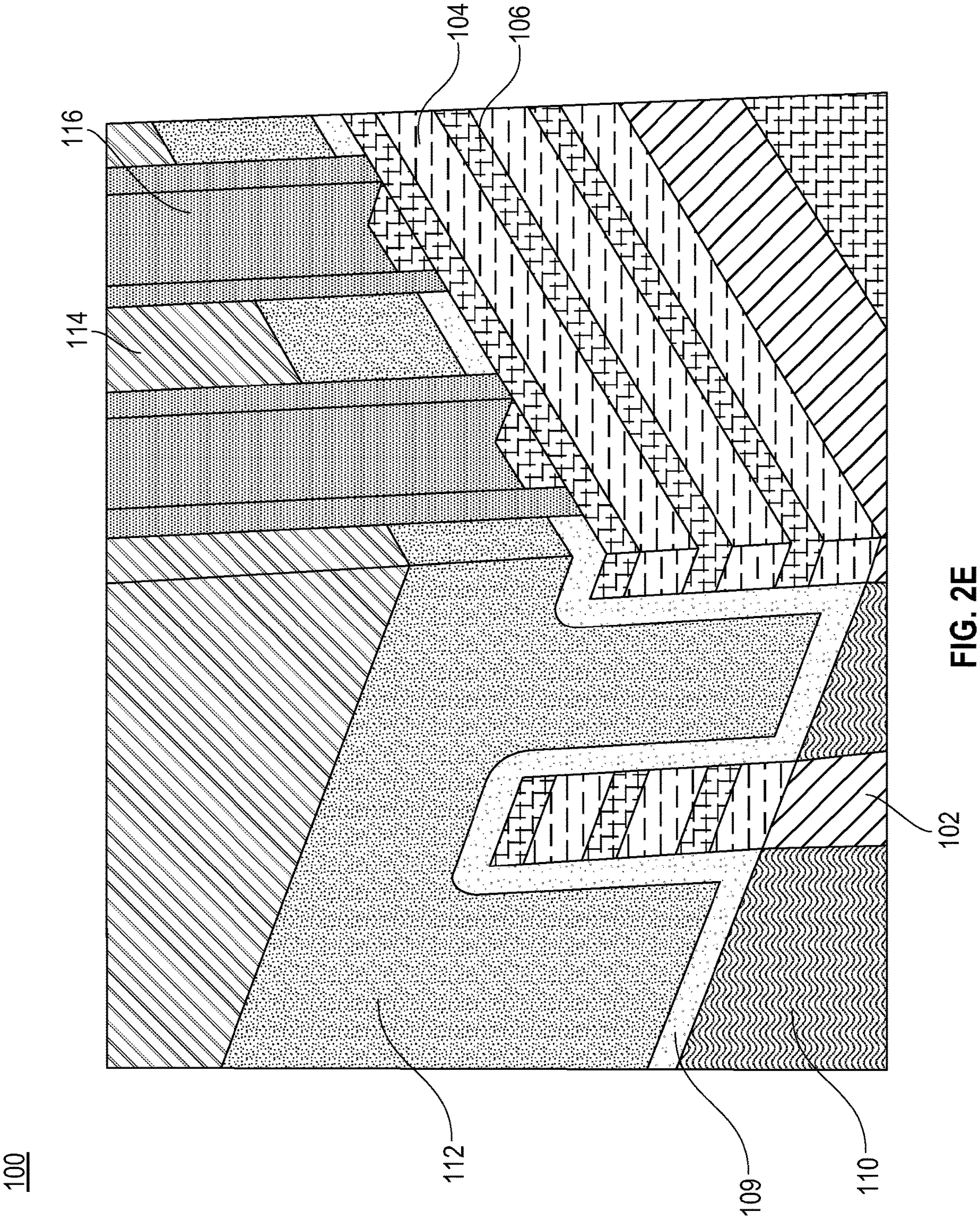

Referring to FIG. 1A and FIG. 2E, in some embodiments, at operation 22, sidewall spacers 116 are formed along outer sidewalls of the dummy gate structure 113 an on the superlattice structure 101. The sidewall spacers 116 may comprise any suitable insulating materials known in the art, for example, silicon nitride, silicon oxide, silicon oxynitride, silicon carbide, or the like. In some embodiments, the sidewall spacers are formed using any suitable conventional deposition and patterning process known in the art, such as atomic layer deposition, plasma enhanced atomic layer deposition, plasma enhanced chemical vapor deposition, low-pressure chemical vapor deposition, or isotropic deposition.

Figure 2F:
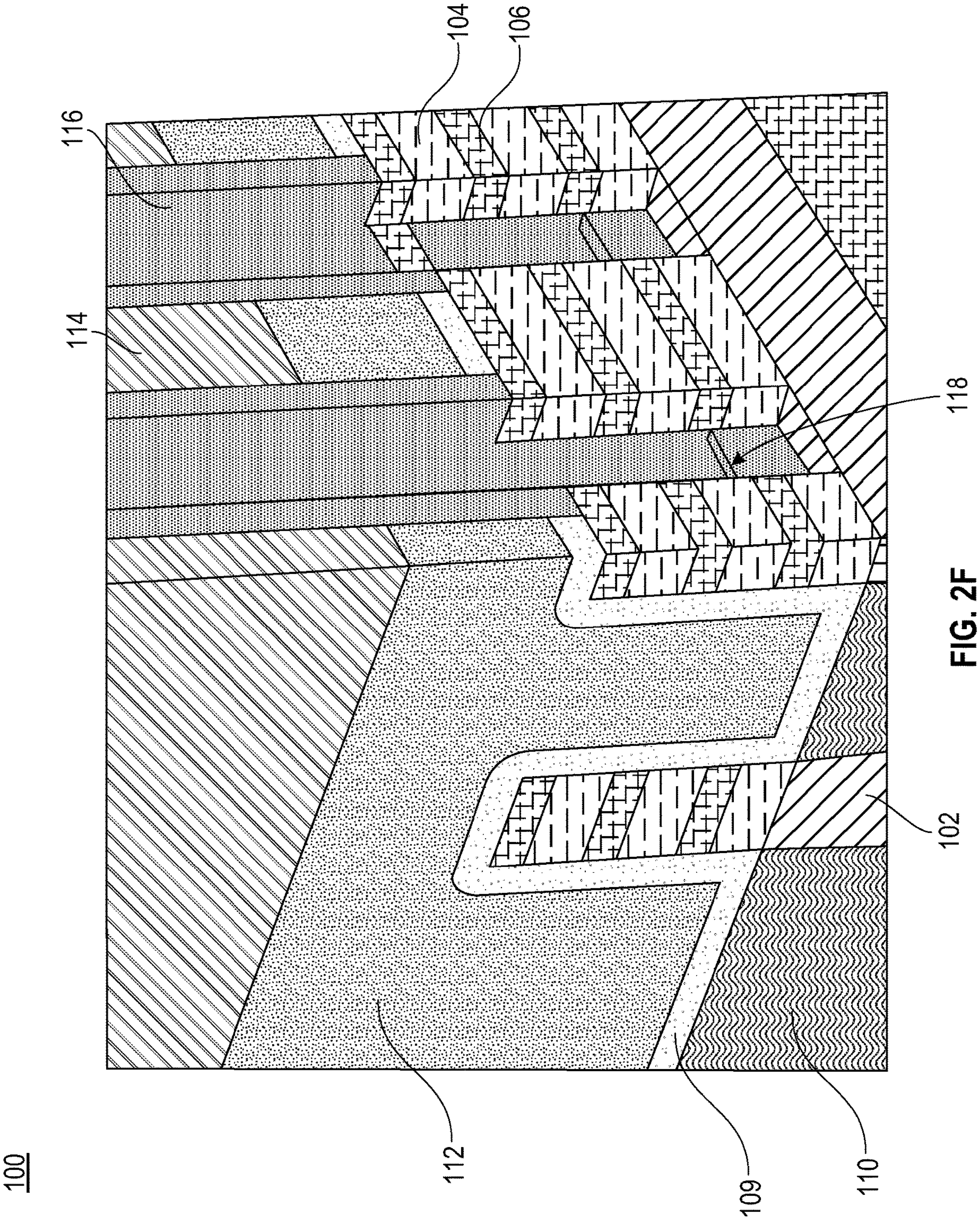

Referring to FIG. 1A and FIG. 2F, at operation 24, in one or more embodiments, source/drain trenches 118 are formed adjacent (i.e., on either side) the superlattice structure 101.

Figure 2G:
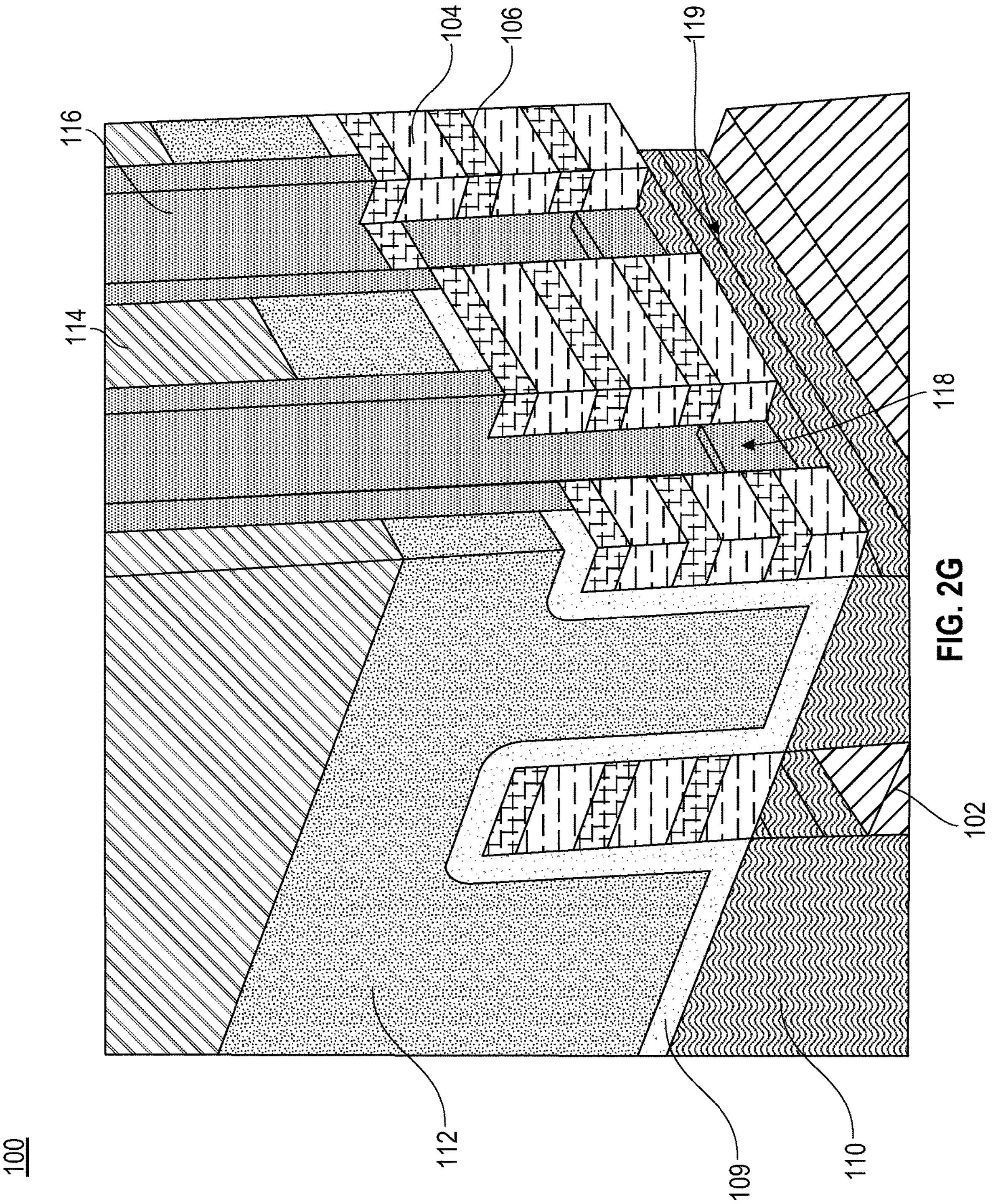

With reference to FIG. 1A and FIG. 2G, at operation 26, in one or more embodiments, the source/drain trenches 118 are deepened and expanded by lateral etching to form cavities 119 under the superlattice structure 101. The cavities 119 may have any suitable depth and width. In one or more embodiments, the cavity 119 extends through the shallow trench isolation 110 into the substrate 102. In one or more embodiments, the etch stop layer 103 is removed during the formation of the cavity 119 etch such that the cavity 119 extends to the substrate 102.

The cavity 119 may be formed by any suitable means known to the skilled artisan. The etch process of operation 26 may include any suitable etch process that is selective to the source/drain trenches 118. In some embodiments the etch process of operation 26 comprises one or more of a wet etch process or a dry etch process. The etch process may be a directional etch.

In some embodiments, the dry etch process may include a conventional plasma etch, or a remote plasma-assisted dry etch process. In an etch process, the device is exposed to $H_2$, $NF_3$, and/or $NH_3$ plasma species, e.g., plasma-excited hydrogen and fluorine species. For example, in some embodiments, the device may undergo simultaneous exposure to $H_2$, $NF_3$, and $NH_3$ plasma. The etch process may be performed in a preclean chamber, which may be integrated into one of a variety of multi-processing platforms. The wet etch process may include a hydrofluoric (HF) acid last process, i.e., the so-called "HF last" process, in which HF etching of surface is performed that leaves surface hydrogen-terminated. Alternatively, any other liquid-based pre-epitaxial pre-clean process may be employed. In some embodiments, the process comprises a sublimation etch for native oxide removal. The etch process can be plasma or thermally based. The plasma processes can be any suitable plasma (e.g., conductively coupled plasma, inductively coupled plasma, microwave plasma).

Figure 2H:
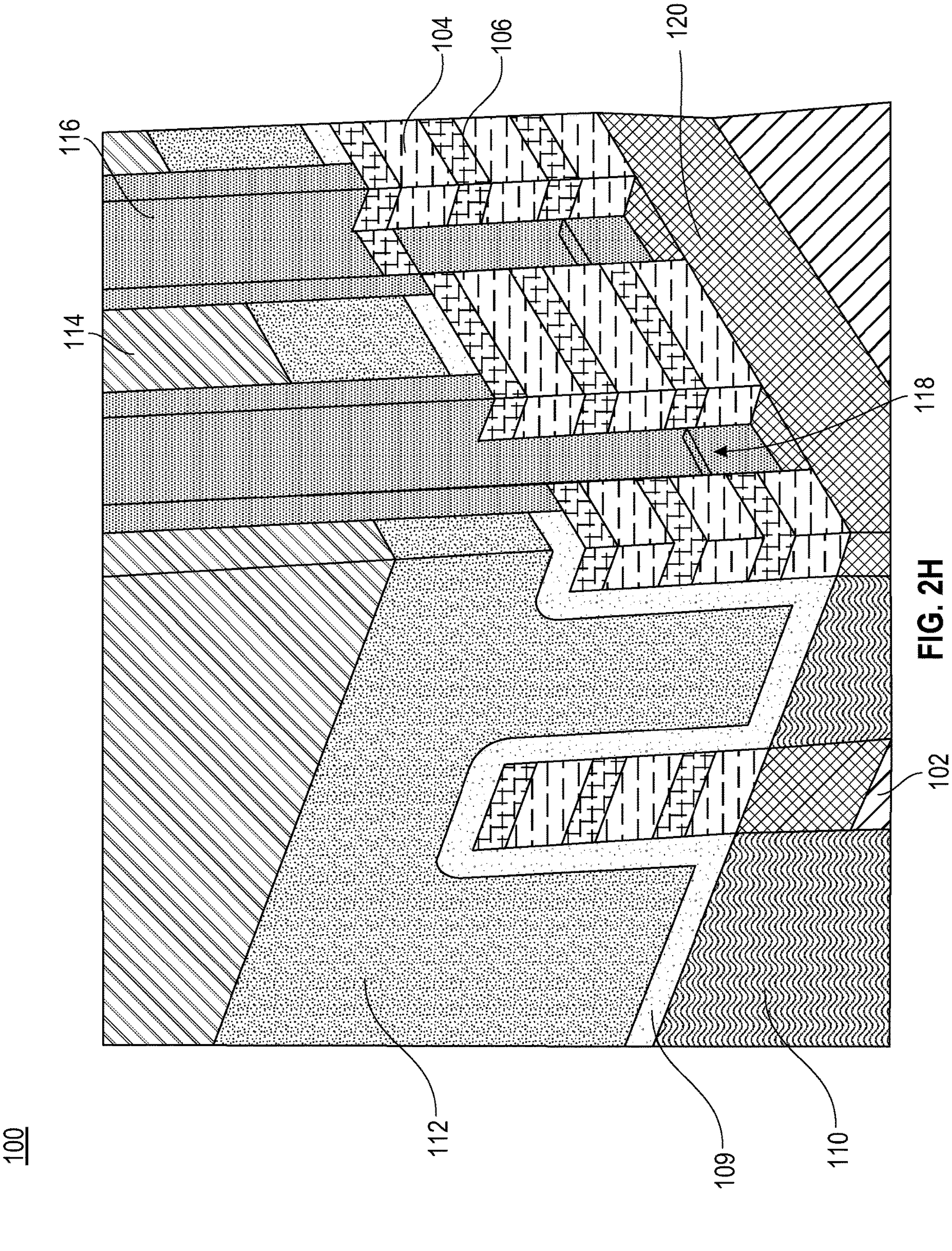

Referring to FIG. 1A and FIG. 2H, at operation 28, a bottom dielectric isolation (BDI) layer 120 is deposited in the cavity 119. The bottom dielectric isolation (BDI) layer 120 may comprise any suitable material known to the skilled artisan. In one or more embodiments, the bottom dielectric isolation (BDI) layer 120 may comprise any suitable material that has a different etch rate than the shallow trench isolation 110, and crystalline silicon and crystalline silicon germanium (SiGe). In one or more embodiments, the bottom dielectric isolation (BDI) layer 120 comprises a dielectric material. As used herein, the term "dielectric material" refers to an electrical insulator that can be polarized in an electric field. In some embodiments, the dielectric material comprises one or more of oxides, carbon doped oxides, silicon dioxide (SiO), porous silicon dioxide ($SiO_2$), silicon nitride (SiN), silicon dioxide/silicon nitride, carbides, oxycarbides, nitrides, oxynitrides, oxycarbonitrides, polymers, phosphosilicate glass, fluorosilicate (SiOF) glass, or organosilicate glass (SiOCH). In one or more embodiments, the bottom dielectric isolation (BDI) layer 120 includes one or more of silicon oxide ($SiO_x$), silicon nitride (SiN), silicon carbide (SiC), boron doped silicon, silicon doped boron, metal, metal oxide, metal silicide, metal carbide, and high-κ material. In some embodiments, the high-κ material is selected from one or more of aluminum oxide ($Al_2O_3$), hafnium oxide ($HfO_2$), and the like. In one or more specific embodiments, the bottom dielectric isolation (BDI) layer 120 comprises silicon oxide $SiO_x$).

In some embodiments, bottom dielectric isolation (BDI) layer 120 is deposited on the substrate 102 using conventional chemical vapor deposition methods.

Figure 2I:
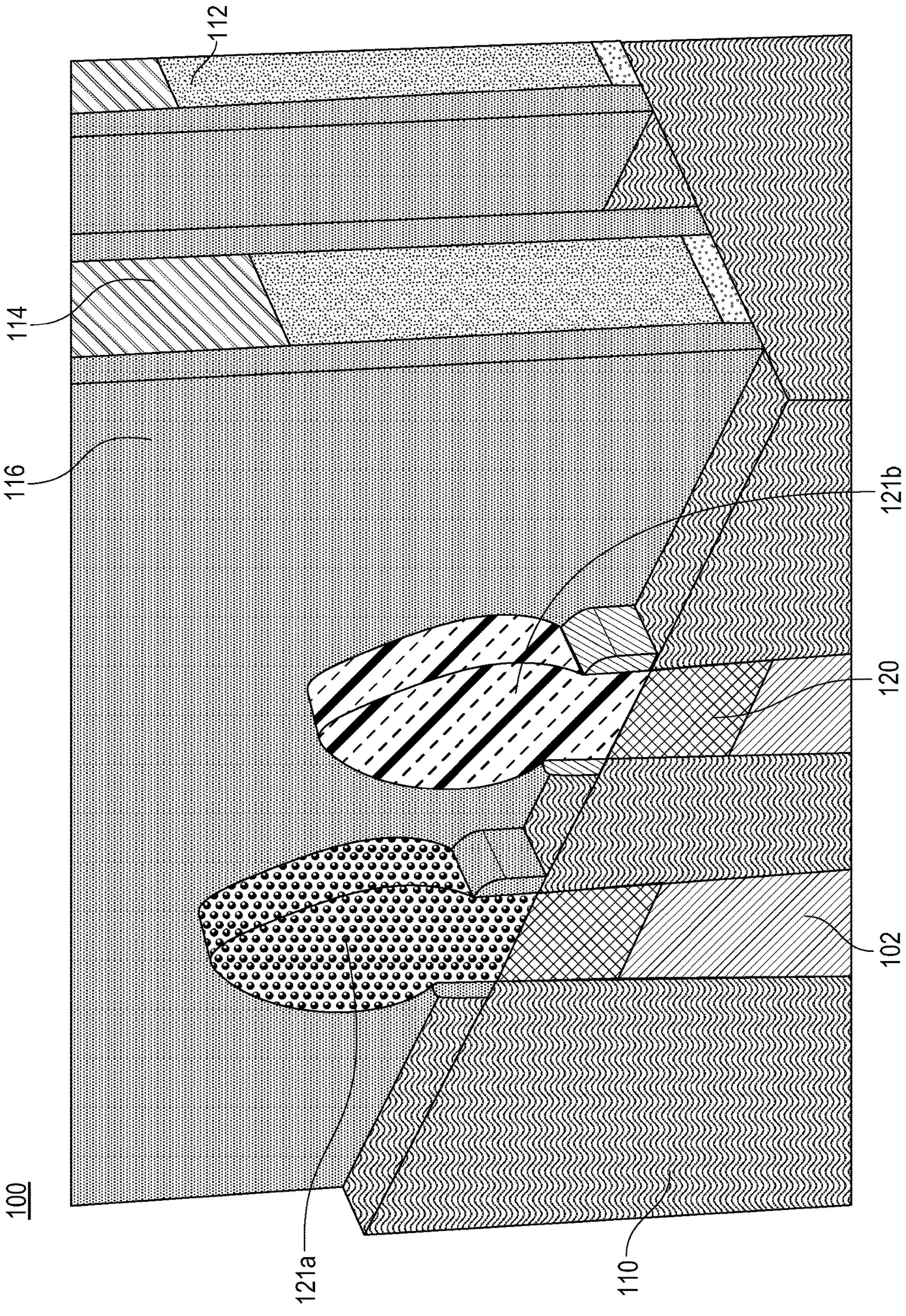

With reference to FIG. 2I and to FIG. 1A, at operation 30, in some embodiments, the embedded source/drain 121*a*, 121*b* regions form in a source/drain trenches 118. In some embodiments, the embedded source 121*a* is formed adjacent a first end of the superlattice structure 101 and the drain 121*b* is formed adjacent a second, opposing end of the superlattice structure 101. In some embodiments, the source/drain 121*a*, 121*b* regions are formed from any suitable semiconductor material, such as but not limited to silicon (Si), germanium (Ge), silicon germanium (SiGe), silicon phosphorous (SiP), silicon arsenic (SiAs), or the like. In some embodiments, the source/drain 121*a*, 121*b* regions may be formed using any suitable deposition process, such as an epitaxial deposition process. In some embodiments, the source/drain 121*a*, 121*b* regions are independently doped with one or more of phosphorus (P), arsenic (As), boron (B), and gallium (Ga).

Figure 2J:
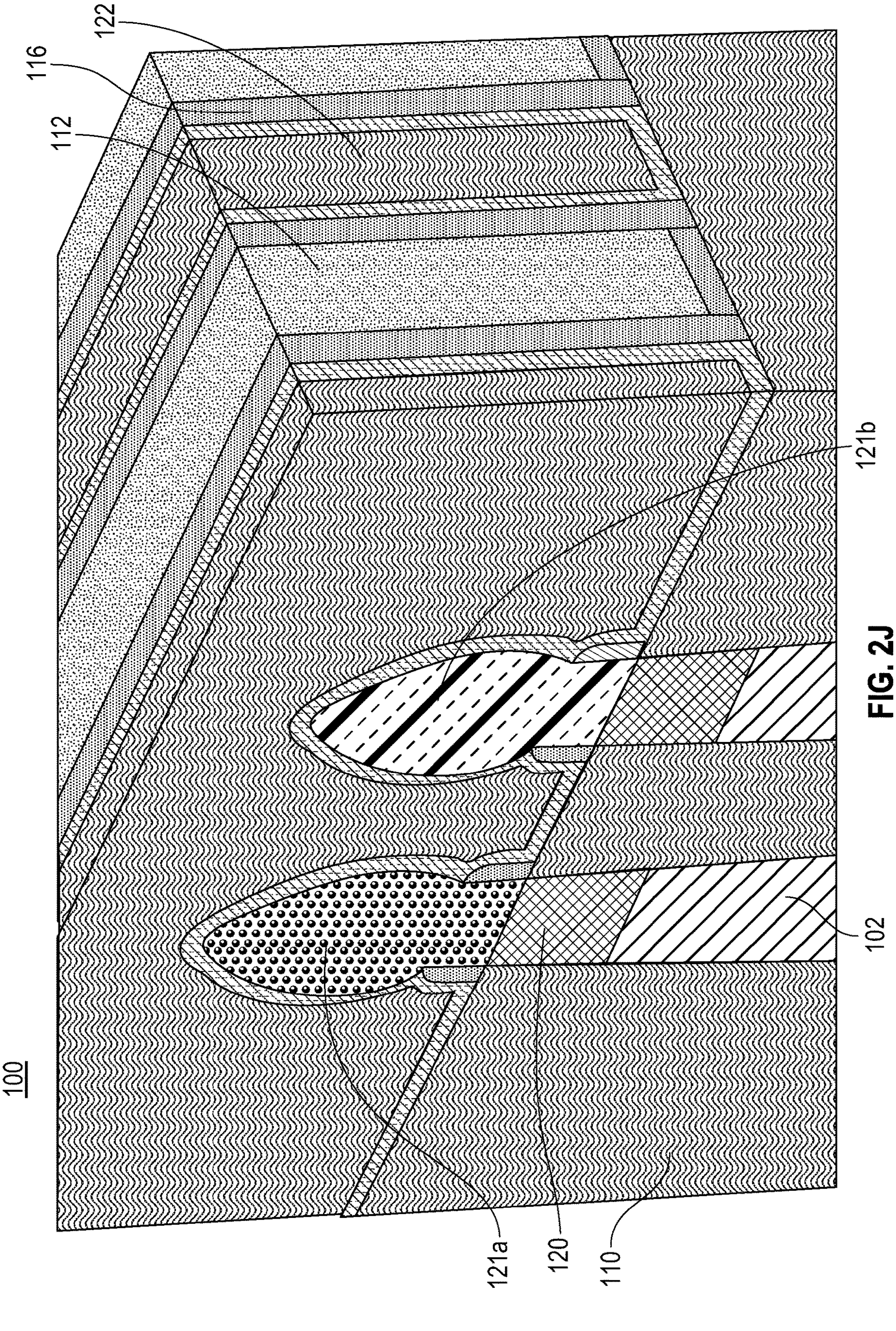
Figure 3A:
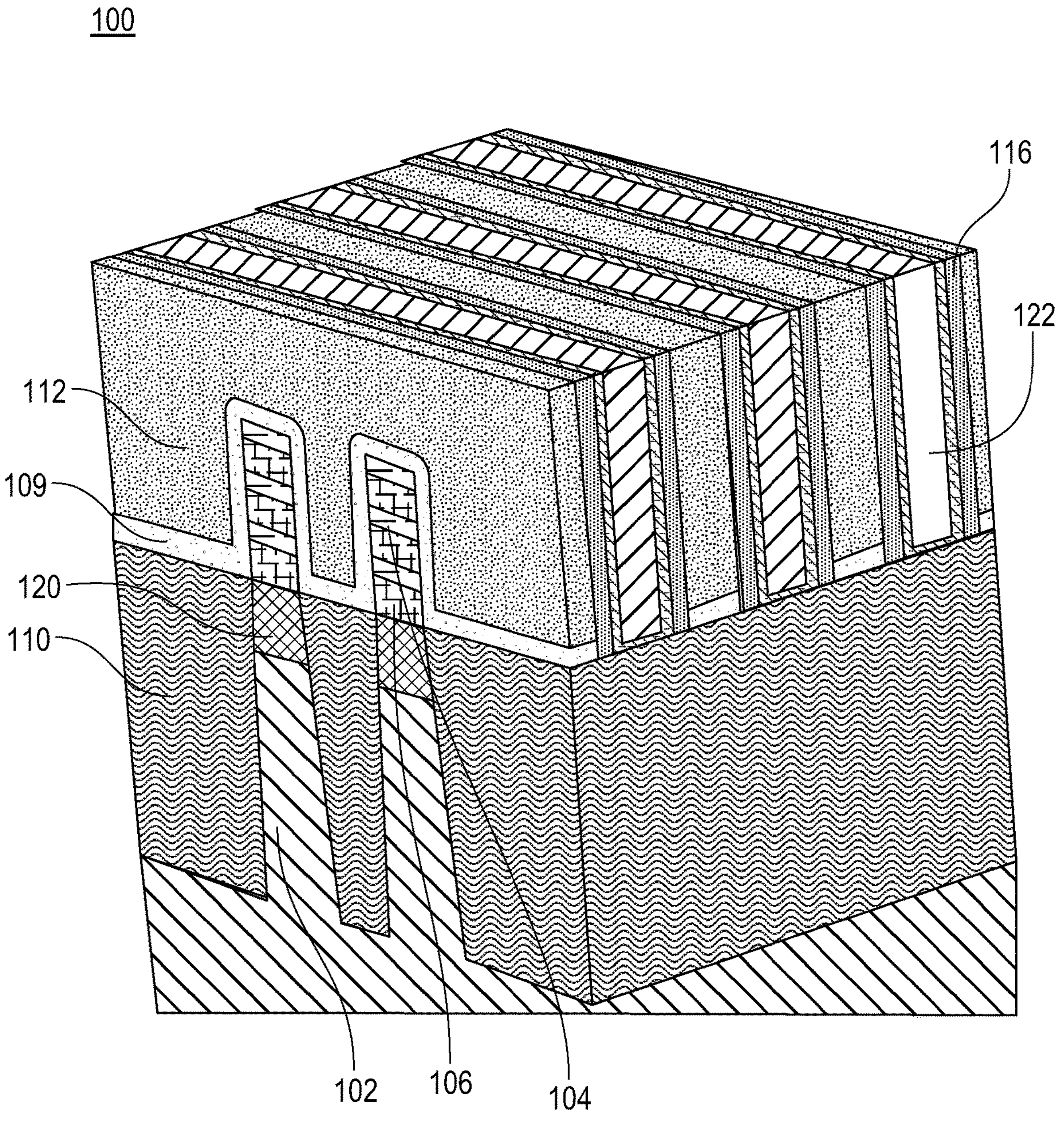
FIG. 3A-3J illustrate cross-section views of a device according to the method of one or more embodiments.

Referring to FIG. 1A and FIG. 2J, at operation 32, an inter-layer dielectric (ILD) layer 122 is blanket deposited over the substrate 102, the dummy gate structure 113, and the sidewall spacers 116. The ILD layer 122 may be deposited using a conventional chemical vapor deposition method (e.g., plasma enhance chemical vapor deposition and low-pressure chemical vapor deposition). In one or more embodiments, ILD layer 122 is formed from any suitable dielectric material such as, but not limited to, undoped silicon oxide, doped silicon oxide (e.g., BPSG, PSG), silicon nitride, and silicon oxynitride. In one or more embodiments, ILD layer 122 is then polished back using a conventional chemical mechanical planarization method to expose the top of the dummy gate structure 113. In some embodiments, the ILD layer 122 is polished to expose the top of the dummy gate structure 113 and the top of the sidewall spacers 116, as illustrated in FIG. 3A.

FIGS. 3A-3J are the fabrication steps of operations 32 through 52 in FIG. 1B and illustrate the formation of a single diffusion break (SDB).

Figure 3B:
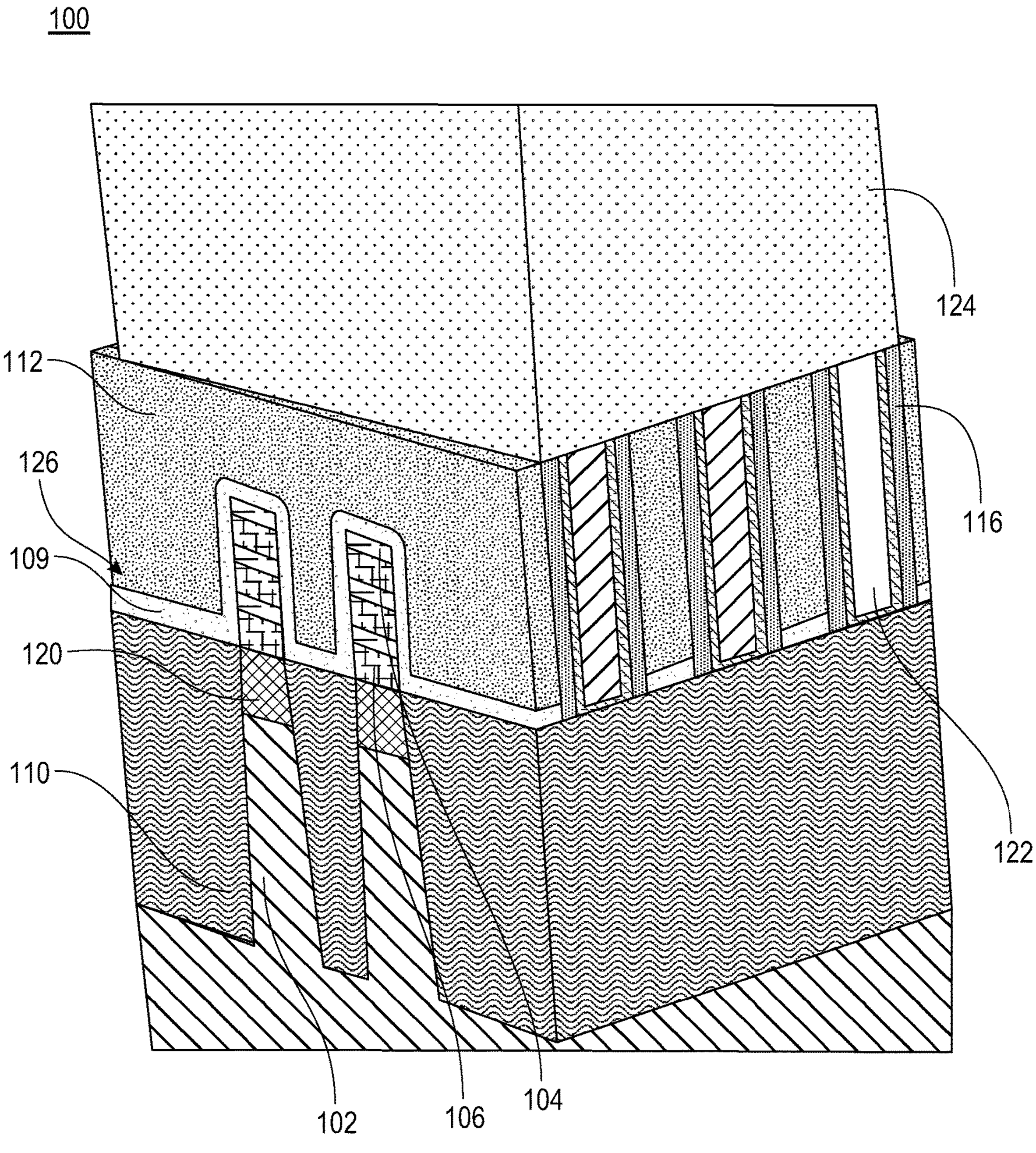

Referring to FIG. 1B and FIG. 3B, at operation 34 a resist material 124 is formed on a top surface of the dummy gate structure 113 and is patterned to form a single diffusion break opening 126.

Figure 3C:
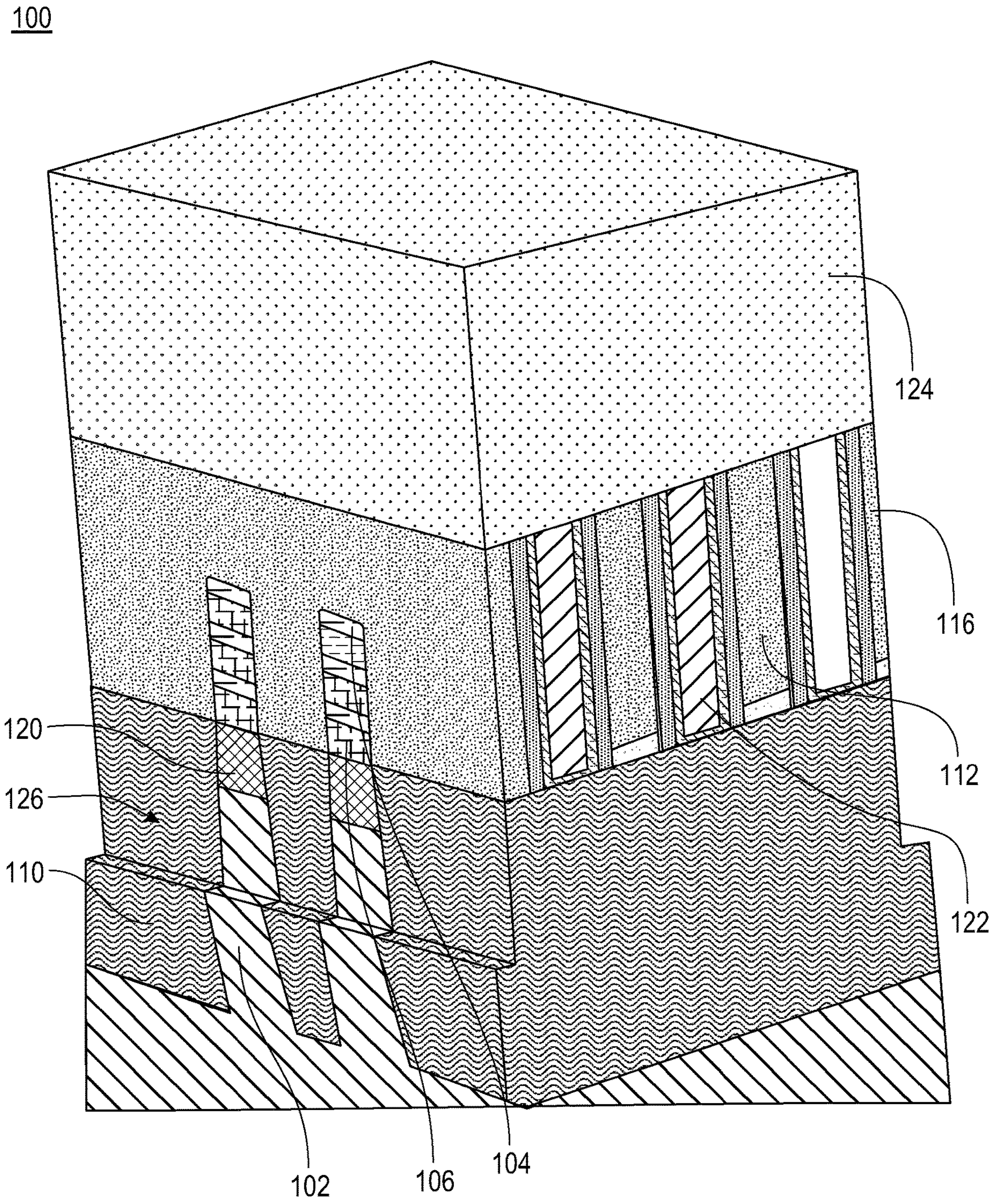

Referring to FIG. 1B and FIG. 3C, at operation 36, in one or more embodiments, the dummy gate structure 113 and resist material 124 may be etched to expose the superlattice structure 101. The ILD layer 122 protects the source and drain regions during the removal of the dummy gate structure 113. The dummy gate structure 113 may be removed using any conventional etching method such as a plasma dry etch or a wet etch. In some embodiments, the dummy gate structure 113 comprises poly-silicon and the dummy gate structure 113 is removed by a selective etch process. In some embodiments, the dummy gate structure 113 comprises poly-silicon and the superlattice structure 101 comprises alternating layers of silicon (Si) and silicon germanium (SiGe).

Figure 3D:
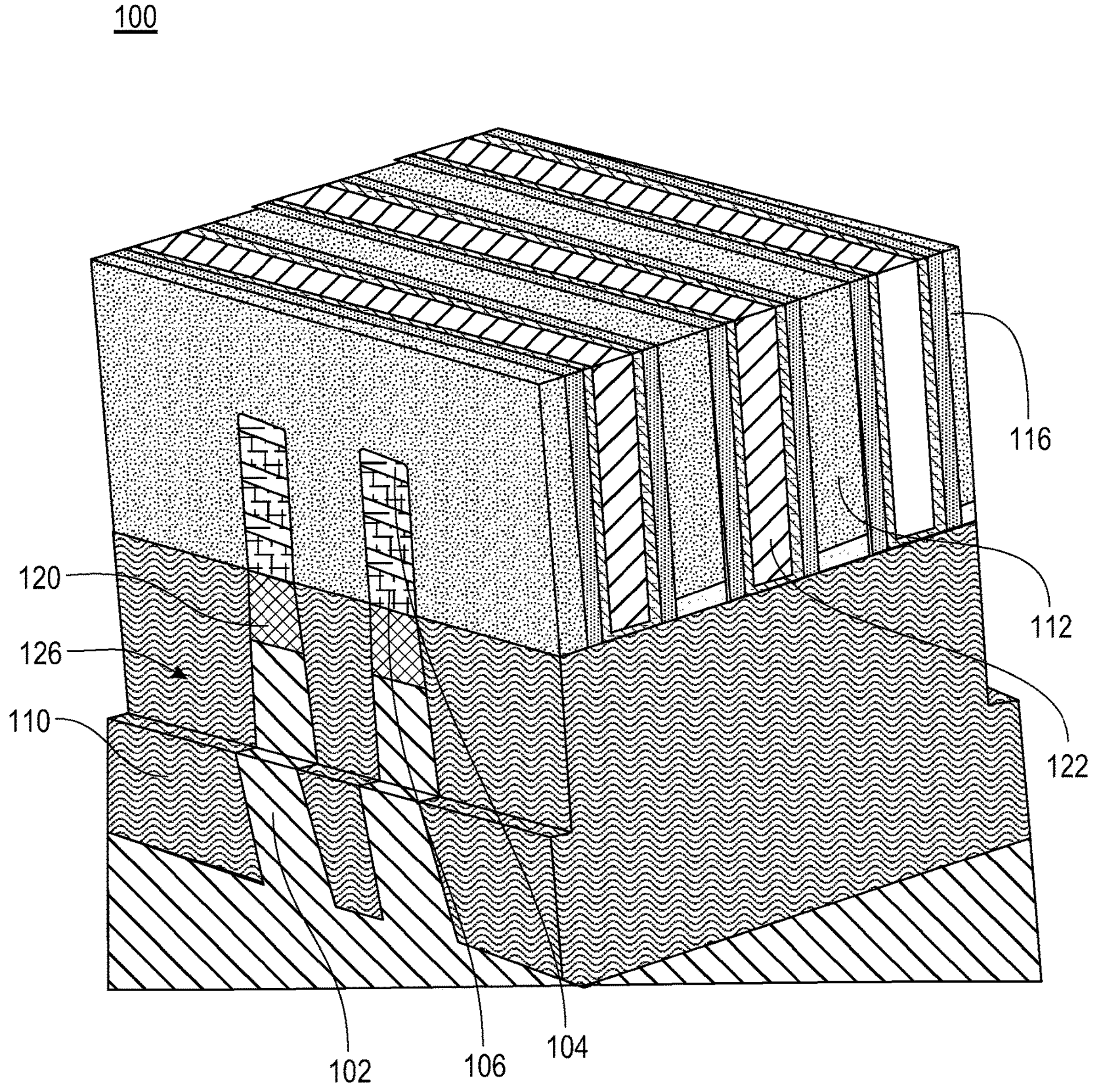

With reference to FIG. 1B and FIG. 3D, at operation 38, the resist material 124 is removed by stripping to expose the top surface of the device 100.

Figure 3E:
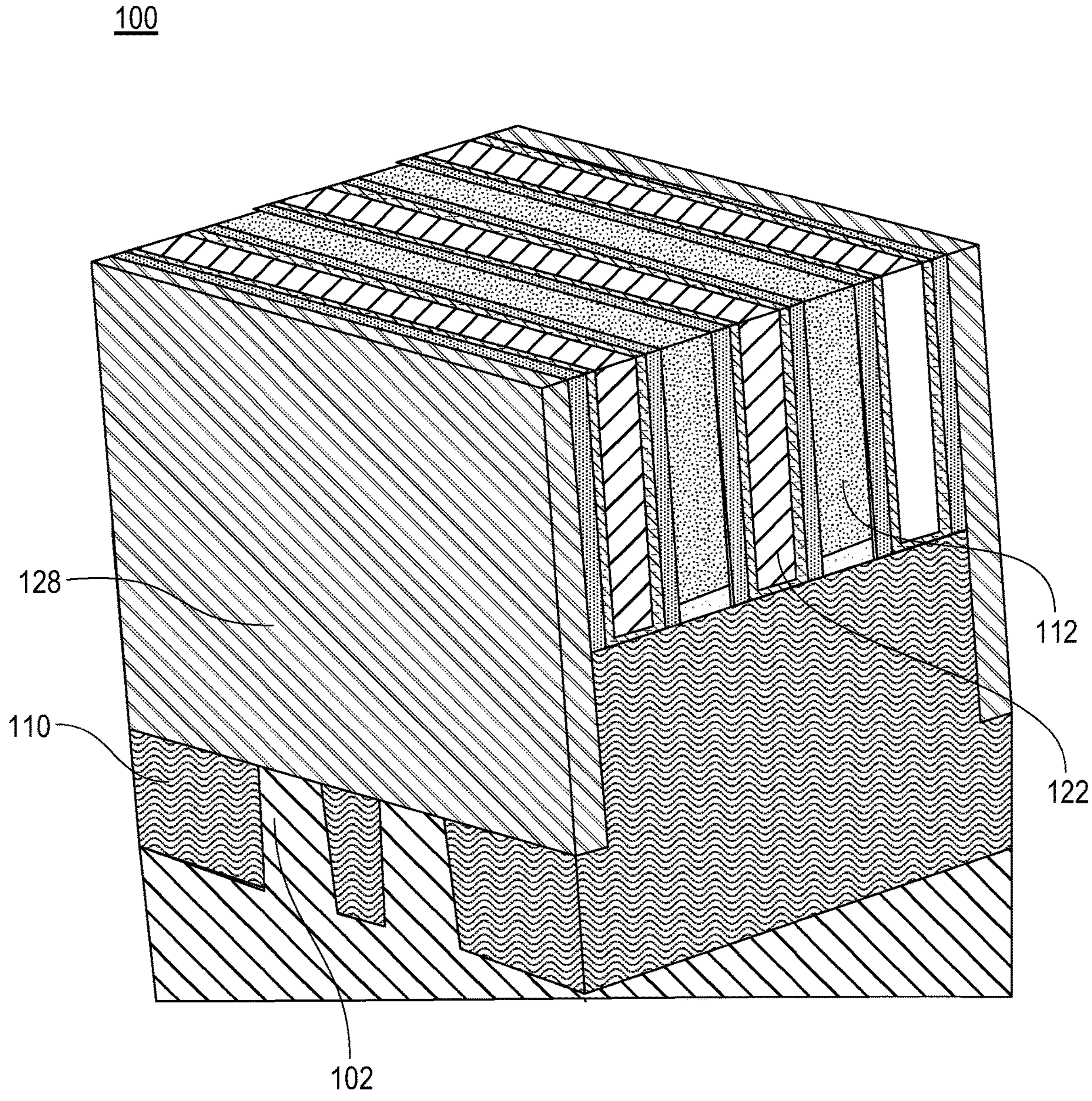

Referring to FIG. 1B and FIG. 3E, at operation 40, a diffusion break fill material 128 is deposited in the single diffusion break opening 126 adjacent to the superlattice structure 101. The diffusion break fill material 128 may comprise any suitable material known to the skilled artisan. In one or more embodiments, the diffusion break fill material 128 comprises a dielectric material. In other embodiments, the diffusion break fill material 128 comprises one or more of a dielectric material and a metal. In such embodiments where the diffusion break fill material 128 comprises a dielectric material and a metal, the metal has a thickness/height in a range of from about 5 nm to about 60 nm, or in a range of from about 10 nm to about 50 nm, and the metal is located on the bottom of the diffusion break fill material 128. In other words, the metal is located in contact with the shallow trench isolation 110 and in contact with the substrate 102. In one or more embodiments, a dielectric material comprises the rest of the diffusion break fill material 128, such that the dielectric material has a thickness in a range of from 80 nm to 90 nm.

In one or more unillustrated embodiments, the formation of the semiconductor device, e.g., GAA, continues according to traditional procedures with nanosheet release and replacement metal gate formation. Specifically, in one or more unillustrated embodiments, the plurality of semiconductor material layers 104 are selectively etched between the plurality of horizontal channel layers 106 in the superlattice structure 101. For example, where the superlattice structure 101 is composed of silicon (Si) layers and silicon germanium (SiGe) layers, the silicon germanium (SiGe) is selectively etched to form channel nanowires. The plurality of semiconductor material layers 104, for example silicon germanium (SiGe), may be removed using any well-known etchant that is selective to the plurality of horizontal channel layers 106 where the etchant etches the plurality of semiconductor material layers 104 at a significantly higher rate than the plurality of horizontal channel layers 106. In some embodiments, a selective dry etch or wet etch process may be used. In some embodiments, where the plurality of horizontal channel layers 106 are silicon (Si) and the plurality of semiconductor material layers 104 are silicon germanium (SiGe), the layers of silicon germanium may be selectively removed using a wet etchant such as, but not limited to aqueous carboxylic acid/nitric acid/HF solution and aqueous citric acid/nitric acid/HF solution. The removal of the plurality of semiconductor material layers 104 leaves voids between the plurality of horizontal channel layers 106. The voids between the plurality of horizontal channel layers 106 have a thickness of about 3 nm to about 20 nm. The remaining horizontal channel layers 106 form a vertical array of channel nanowires that are coupled to the source/drain 121*a*, 121*b* regions. The channel nanowires run parallel to the top surface of the substrate 102 and are aligned with each other to form a single column of channel nanowires.

In one or more unillustrated embodiments, a high-k dielectric is formed. The high-k dielectric can be any suitable high-k dielectric material deposited by any suitable deposition technique known to the skilled artisan. The high-k dielectric of some embodiments comprises hafnium oxide. In some embodiments, a conductive material such as titanium nitride (TiN), tungsten (W), cobalt (Co), aluminum (Al), or the like is deposited on the high-k dielectric to form the replacement metal gate. The conductive material may be formed using any suitable deposition process such as, but not limited to, atomic layer deposition (ALD) in order to ensure the formation of a layer having a uniform thickness around each of the plurality of channel layers.

In one or more unillustrated embodiments, a drain contact to transistor (CT) and contact to gate (CG) are formed. Additionally, the metal (M0) line and metal (M1) line is formed and electrically connected to the via (V1).

Figure 3F:
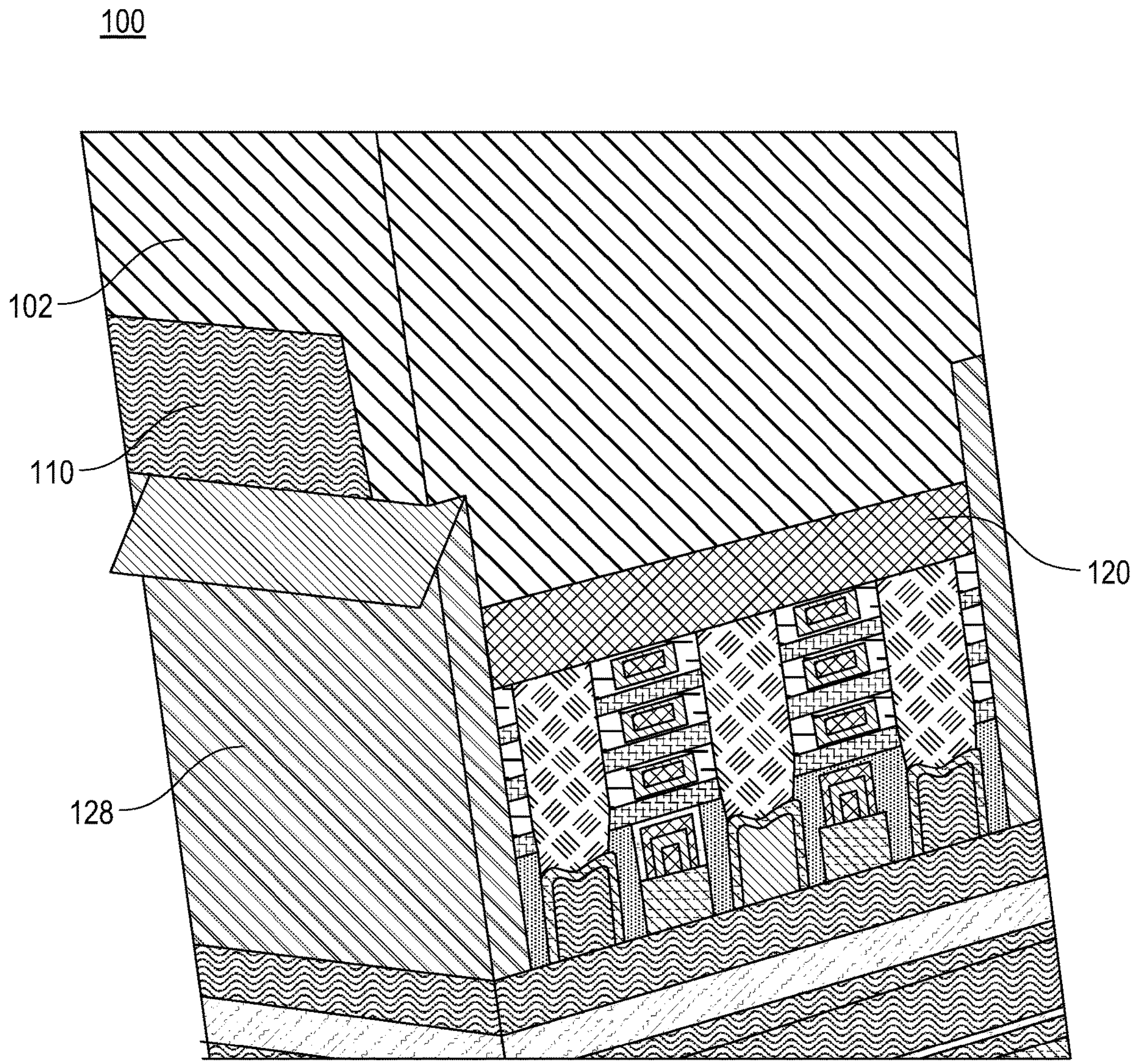
Figure 3G:
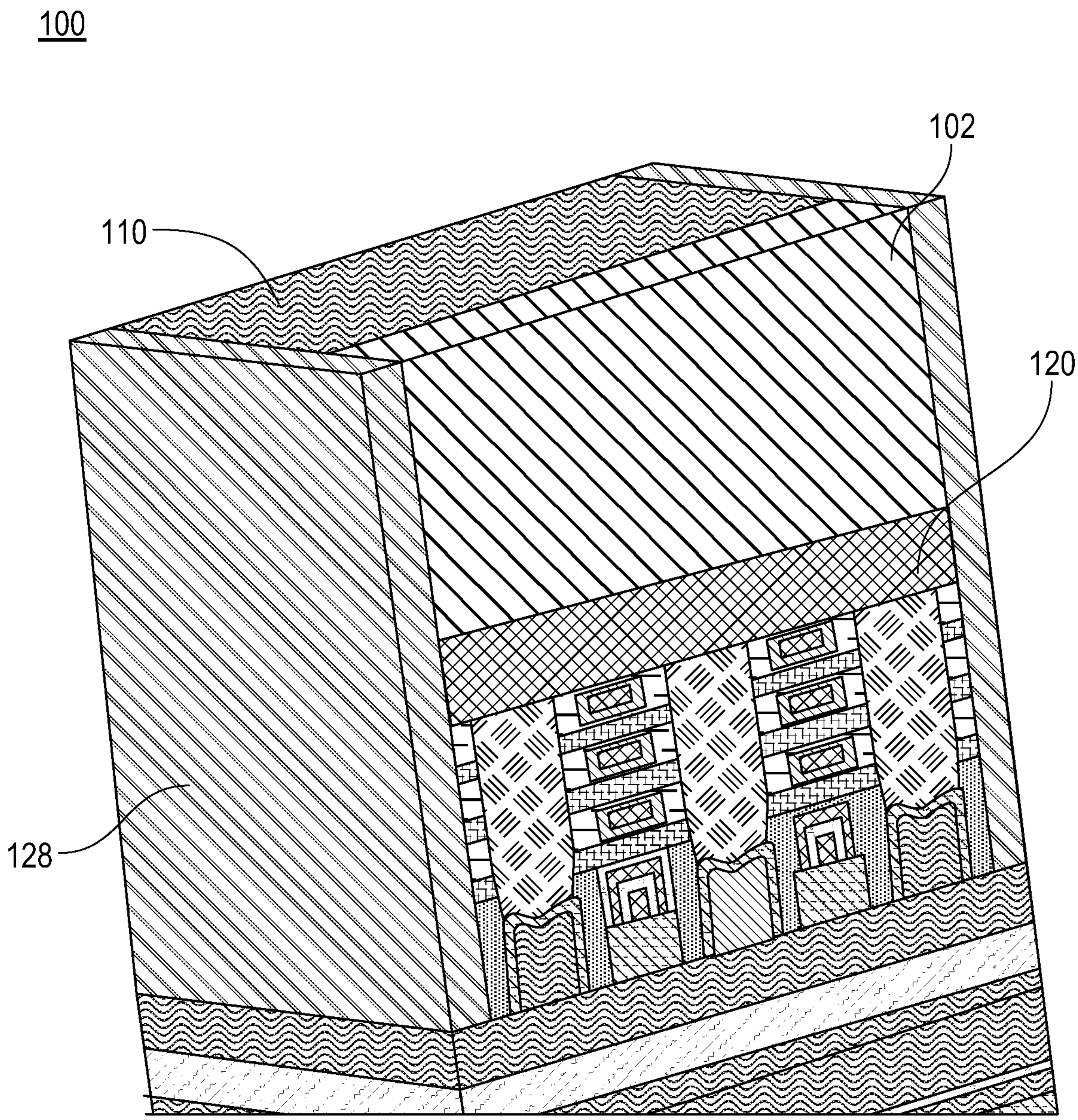

With reference to FIG. 3F, at operation 42 of FIG. 1B, the device 100 is rotated or flipped 180 degrees, such that the substrate 102 is now at the top of the illustration.

Figure 3H:
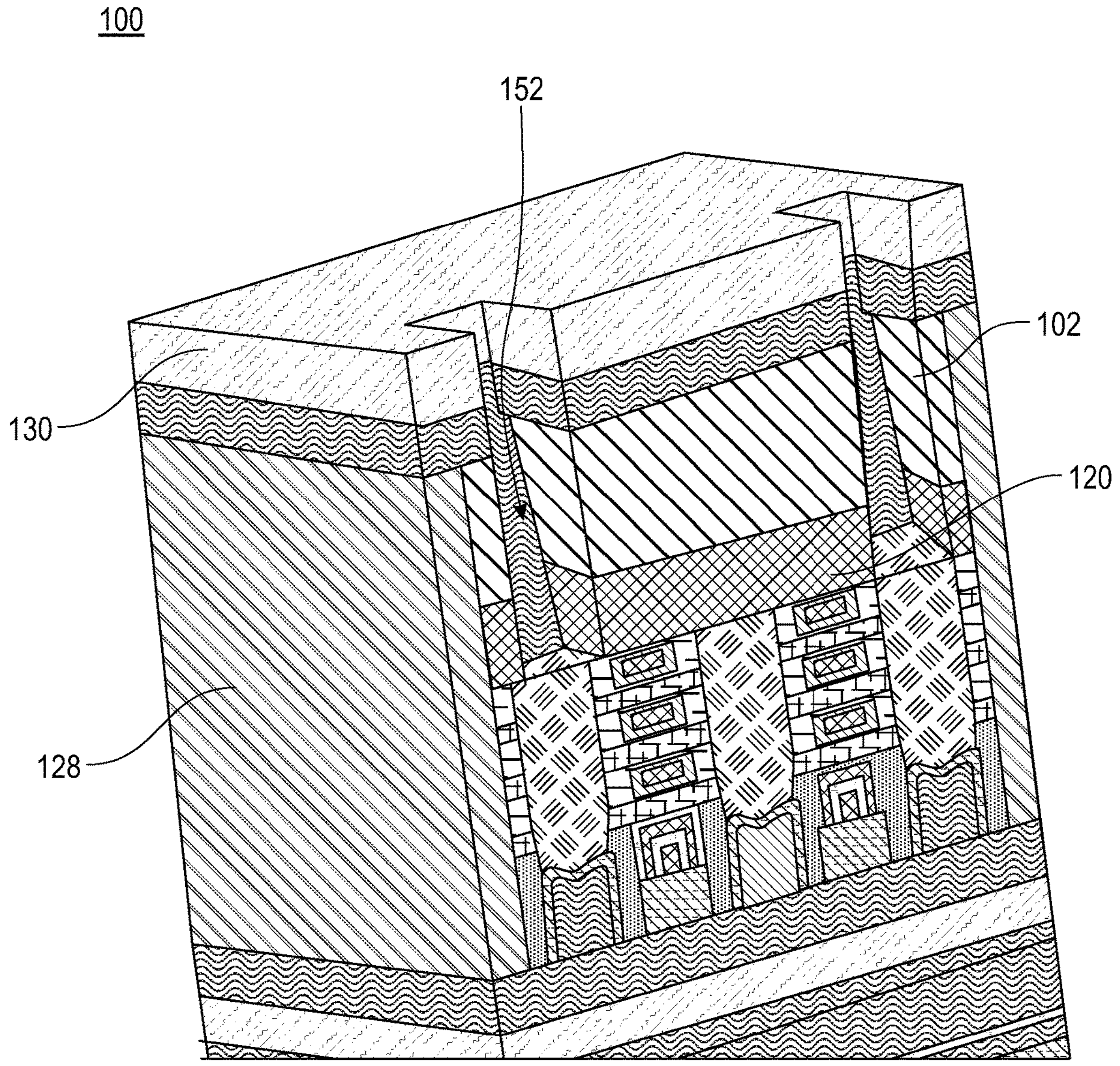

With reference to FIG. 1B and FIG. 3H, at operation 44, the device 100 is planarized, stopping at the diffusion break fill material 128 and not planarizing the substrate 102 and the bottom dielectric isolation (BDI) layer 120. The planarization may be any suitable planarization process known to the skill artisan including, but not limited to, chemical mechanical planarization (CMP). In some embodiments, an advanced chemical mechanical planarization (CMP) process with the diffusion break fill material 128 as an etch stop layer for backside wafer polishing to realize a backside power rail. Advanced CMP uses end-point detection (EDP). Precision process control and EPD are required to minimize dishing and erosion in the structure. Traditional CMP does not use end-point detection (EDP). In one or more embodiments, if the diffusion break fill material 128 comprises a metal, the metal is then removed after the planarization, leaving the diffusion break fill material 128 comprising a dielectric material.

As illustrated in FIG. 3H, at operation 44 of FIG. 1B, in one or more embodiments, an interlayer dielectric material 130 is deposited on the backside on the substrate 102 and on the diffusion break fill material 128. The interlayer dielectric material 130 may be deposited by any suitable means known to one of skill in the art. The interlayer dielectric material 130 may comprise any suitable material known to the skilled artisan. In one or more embodiments, the interlayer dielectric material 130 comprises one or more of silicon nitride (SiN), carbide, or boron carbide, to allow high aspect ratio etch and metallization.

In one or more embodiments, at operation 46, the backside via 152 is patterned. The via 152 may be formed by any suitable means known to the skilled artisan. In one or more embodiments, the via 152 may be formed by patterning and etching the interlayer dielectric material 130. When the via 152 is patterned, it extends from a top surface of the interlayer dielectric material 130 to the bottom dielectric isolation (BDI) layer 120. In one or more embodiments, the bottom dielectric isolation (BDI) layer 120, thus, serves as an etch stop layer. In some embodiments, the aspect ratio of the via 152 is greater than or equal to about 5:1, about 10:1, about 15:1, about 20:1, about 25:1, about 30:1, about 35:1 or about 40:1.

Figure 3I:
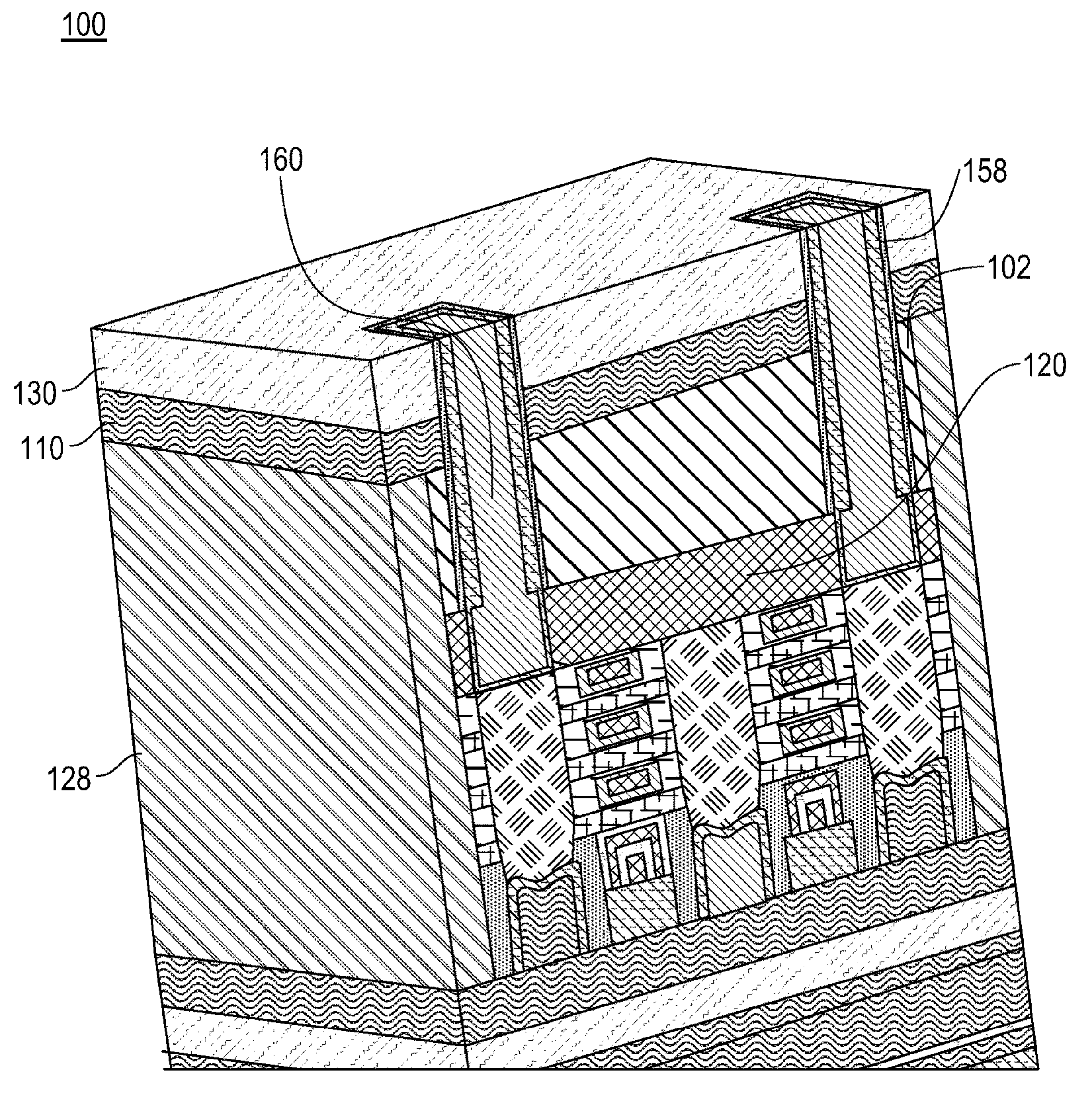

At operation 48 of FIG. 1B, as illustrated in FIG. 3I, the device 100 is silicidated and a barrier layer 158 is deposited in the via 152. The barrier layer 158 may comprise any suitable material known to the skilled artisan. In some embodiments, the barrier layer 158 comprises titanium nitride (TiN) or tantalum nitride (TaN). At operation 50, a metal 160 is deposited in the via 152 on the barrier layer 158. The metal 160 may comprise any suitable metal known to the skilled artisan. In one or more embodiments, the metal 160 is selected from one or more of tungsten (W), molybdenum (Mo), cobalt (Co), copper (Cu), ruthenium (Ru), and the like.

Figure 3J:
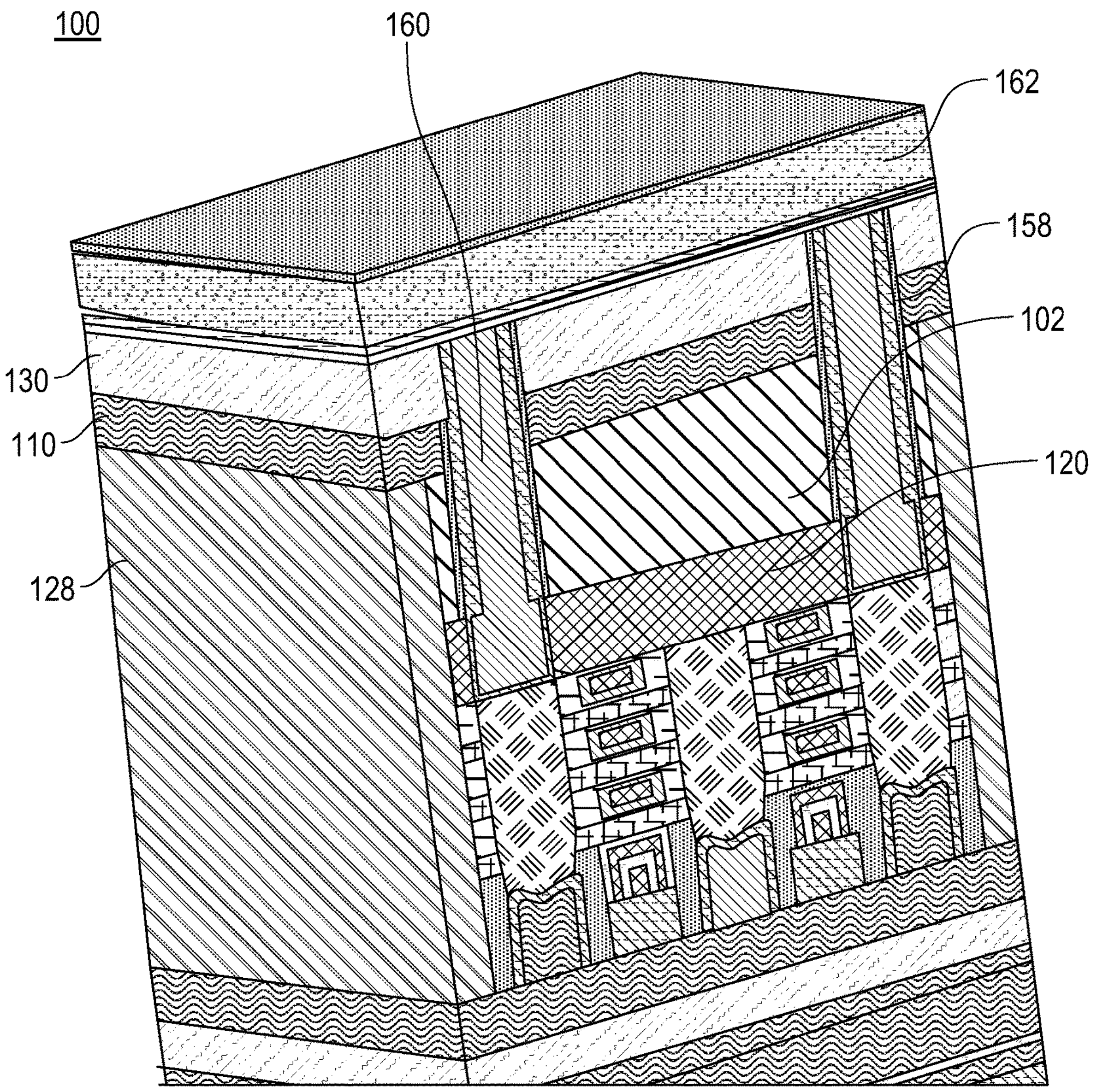

With reference to FIG. 1B and FIG. 3J, at operation 52, the backside metal line (M0) 162 is formed. Without intending to be bound by theory, it is thought that locating the power rail on the backside allows for a gain in the area of the cell in a range of from 20% to 30%.

FIGS. 4A-4J are the fabrication steps of operations 54 through 74 in FIG. 1C, which may occur after the standard fabrication steps illustrated in FIG. 1A and FIGS. 2A-2H and involve the formation of a mixed diffusion break (MDB).

Figure 4A:
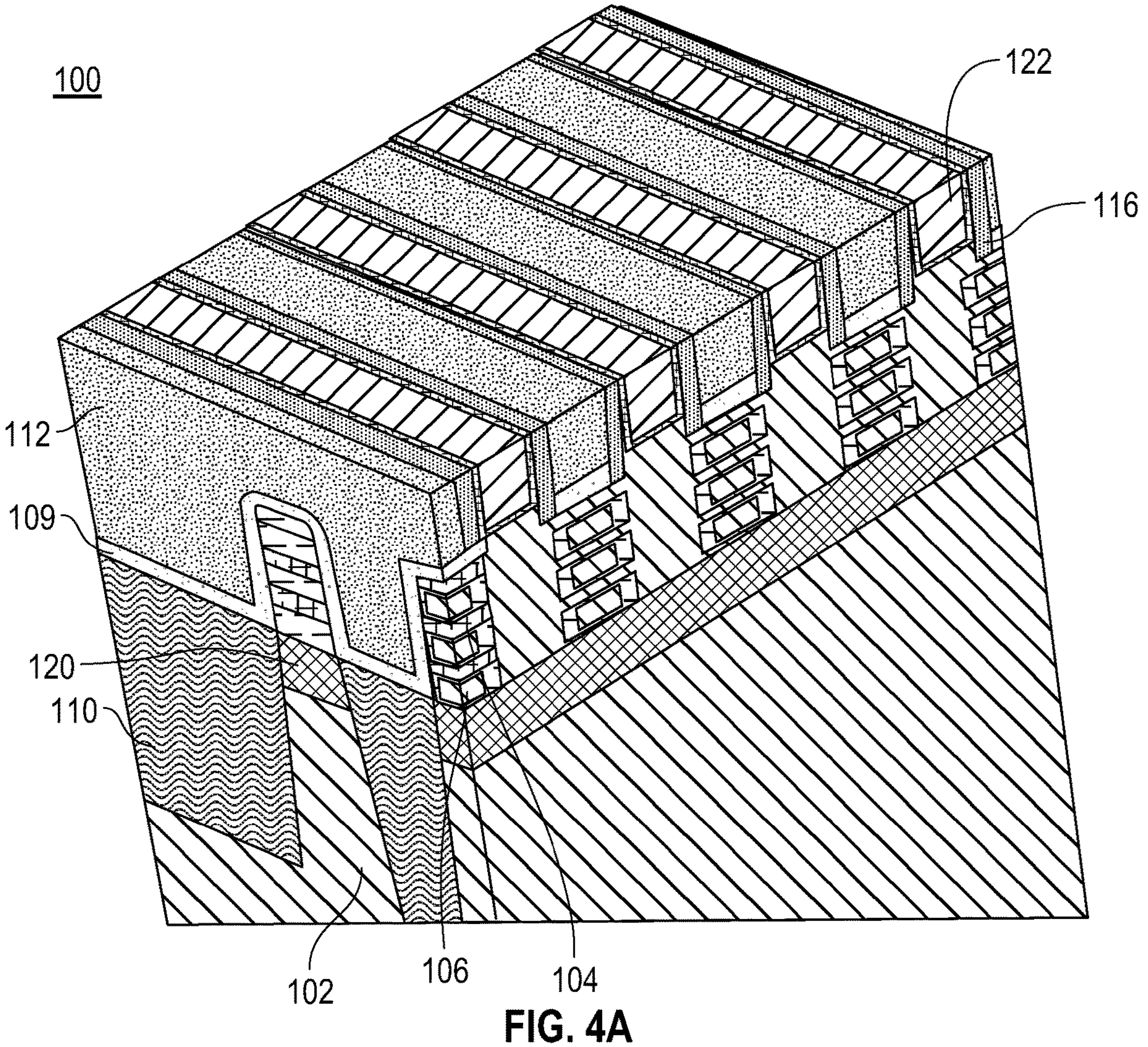
FIG. 4A-4J illustrate cross-section views of a device according to the method of one or more embodiments.

Referring to FIG. 1C and FIG. 4A, at operation 54, an inter-layer dielectric (ILD) layer 122 is blanket deposited over the substrate 102, the dummy gate structure 113, and the sidewall spacers 116. The ILD layer 122 may be deposited using a conventional chemical vapor deposition method (e.g., plasma enhance chemical vapor deposition and low-pressure chemical vapor deposition). In one or more embodiments, ILD layer 122 is formed from any suitable dielectric material such as, but not limited to, undoped silicon oxide, doped silicon oxide (e.g., BPSG, PSG), silicon nitride, and silicon oxynitride. In one or more embodiments, ILD layer 122 is then polished back using a conventional chemical mechanical planarization method to expose the top of the dummy gate structure 113. In some embodiments, the ILD layer 122 is polished to expose the top of the dummy gate structure 113 and the top of the sidewall spacers 116.

Figure 4B:
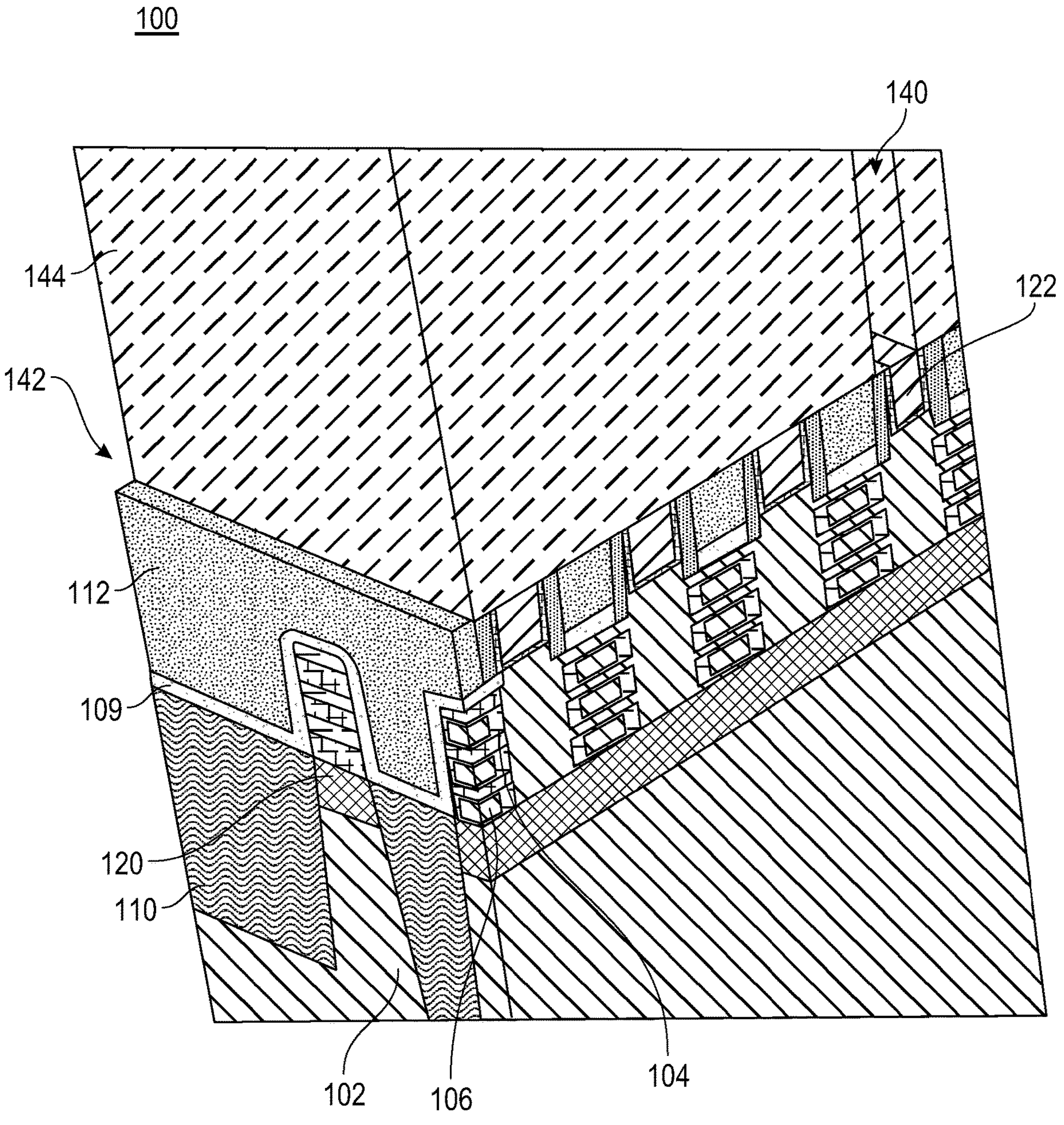

Referring to FIG. 1C and FIG. 4B, at operation 56 a resist material 144 is formed on a top surface of the dummy gate structure 113 and is patterned to form mixed diffusion break openings 140, 142. In one or more embodiments, a single diffusion break opening 142 is formed adjacent to the superlattice structure 101, and a double diffusion break opening 140 is formed over the source/drain region.

Figure 4C:
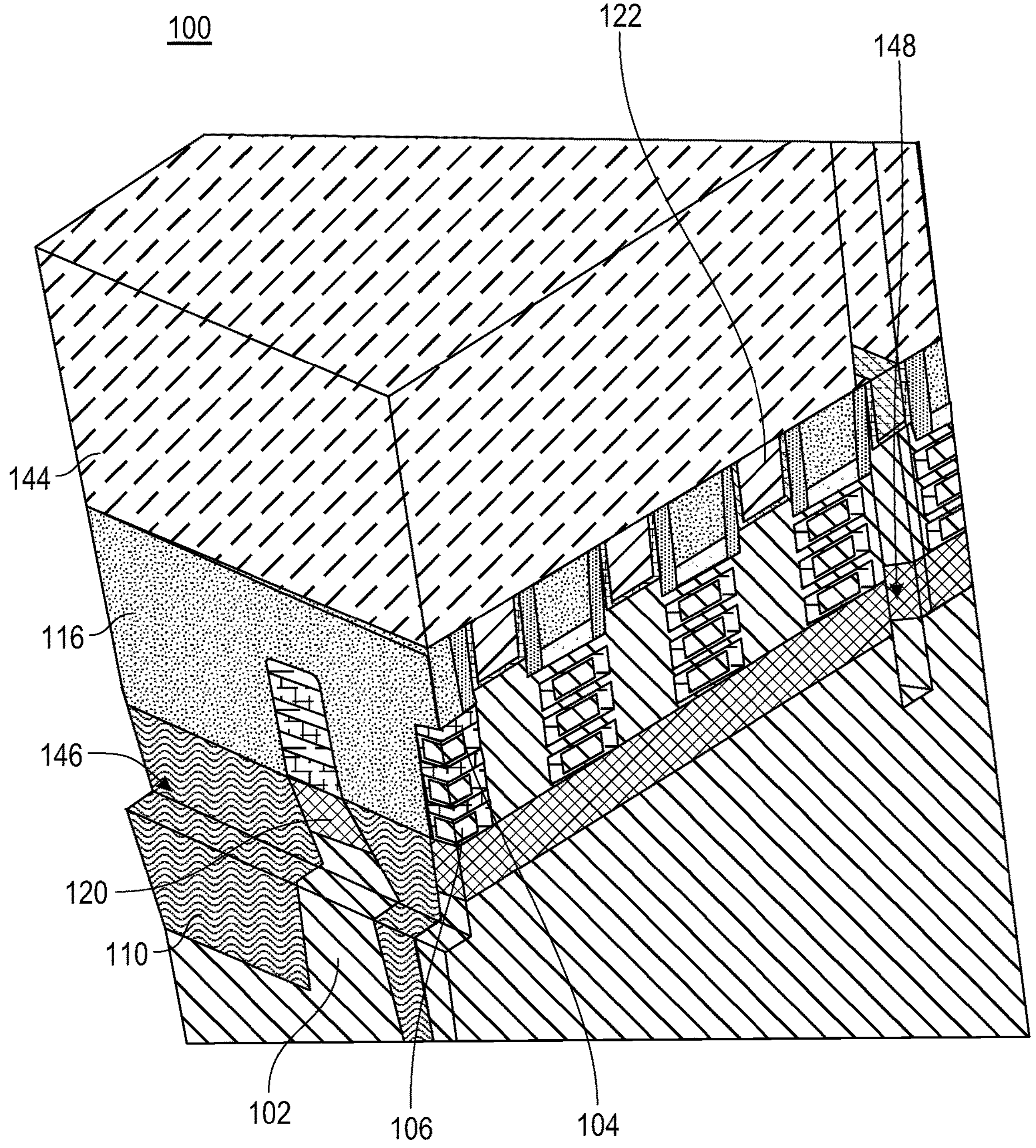

Referring to FIG. 1C and FIG. 4C, at operation 58, in one or more embodiments, the dummy gate structure 113 and resist material 144 may be etched to expose the channel region of the superlattice structure 101 and to extend the double diffusion break opening 140 over the source/drain region to extend to the bottom dielectric isolation (BDI) layer 120 and forming an extended double diffusion barrier opening 148.

The resist material 144 protects the source and drain regions during the removal of the dummy gate structure 113. The dummy gate structure 113 may be removed using any conventional etching method such as a plasma dry etch or a wet etch. In some embodiments, the dummy gate structure 113 comprises poly-silicon and the dummy gate structure 113 is removed by a selective etch process. In some embodiments, the dummy gate structure 113 comprises poly-silicon and the superlattice structure 101 comprises alternating layers of silicon (Si) and silicon germanium (SiGe).

Figure 4D:
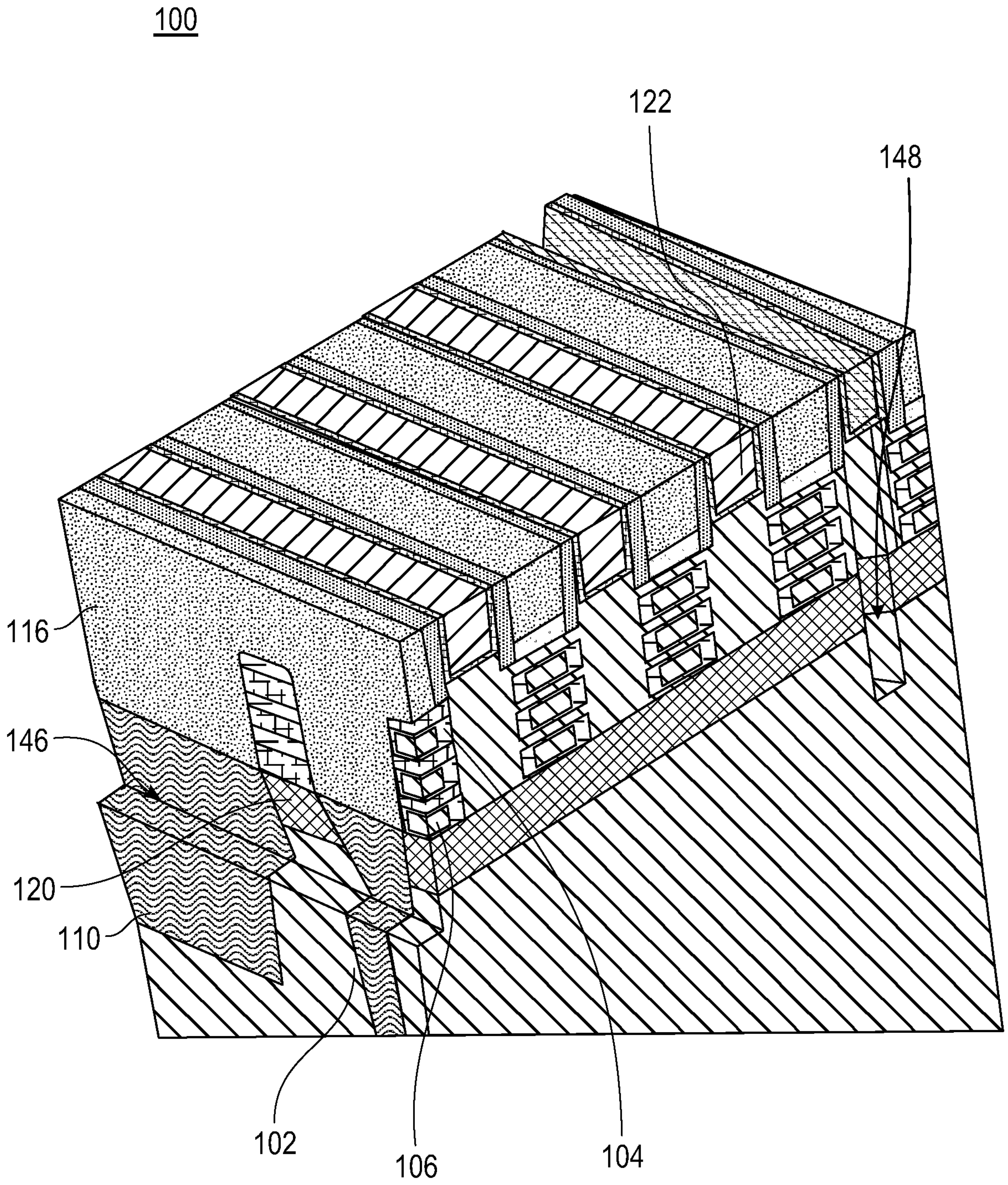

With reference to FIG. 1C and FIG. 4D, at operation 60, the resist material 144 is removed by stripping to expose the top surface of the device 100.

Figure 4E:
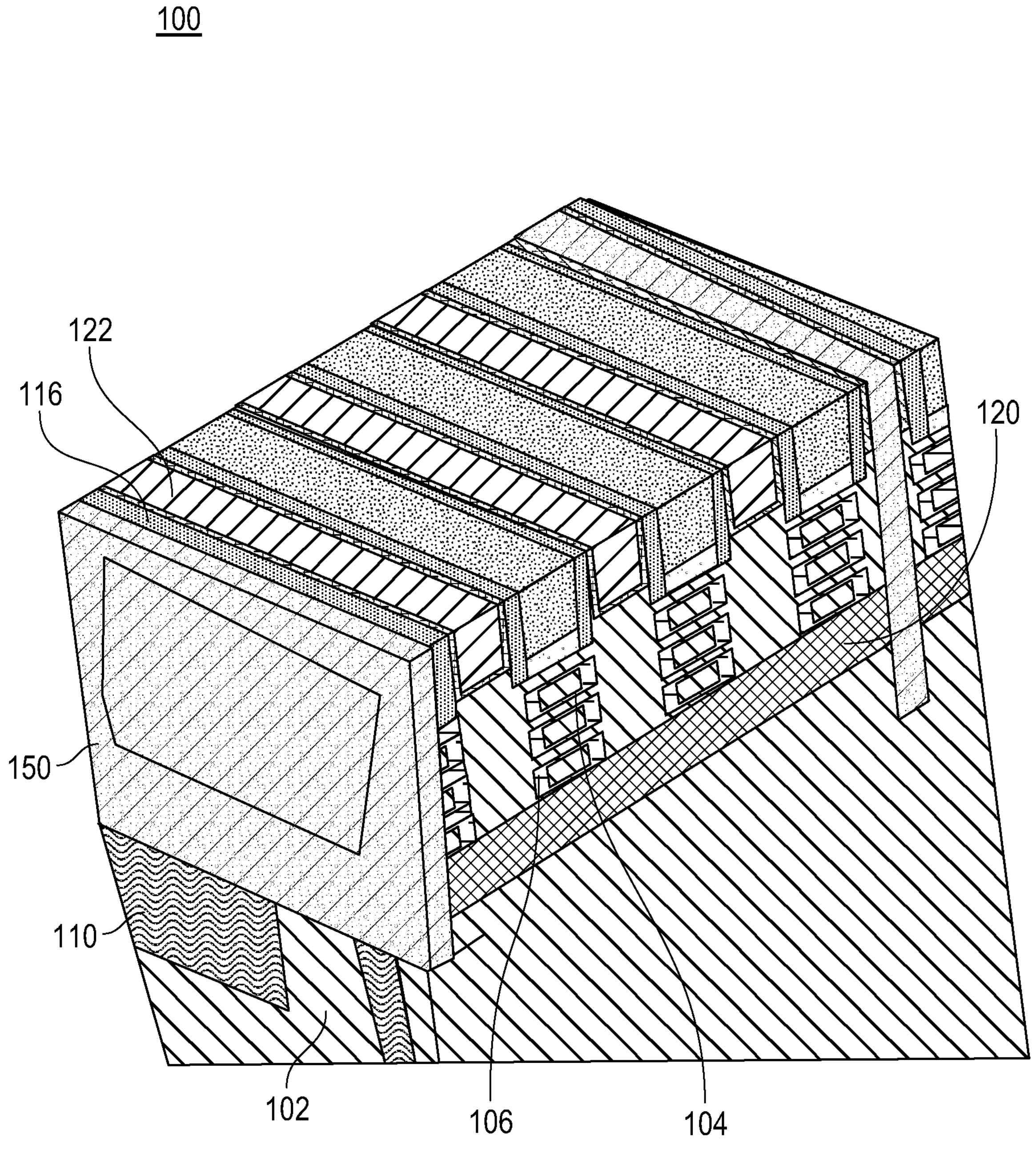

Referring to FIG. 1C and FIG. 4E, at operation 62, a mixed diffusion break fill material 150 is deposited in the single diffusion break opening 142 adjacent to the superlattice structure 101 and in the extended double diffusion barrier opening 148. The mixed diffusion break fill material 150 may comprise any suitable material known to the skilled artisan. In one or more embodiments, the mixed diffusion break fill material 150 comprises a dielectric material. In other embodiments, the mixed diffusion break fill material 150 comprises one or more of a dielectric material and a metal. In such embodiments where the diffusion break fill material 150 comprises a dielectric material and a metal, the metal has a thickness/height in a range of from about 5 nm to about 60 nm, or in a range of from about 10 nm to about 50 nm, and the metal is located on the bottom of the diffusion break fill material 150. In other words, the metal is located in contact with the shallow trench isolation 110 and in contact with the substrate 102. In one or more embodiments, a dielectric material comprises the rest of the diffusion break fill material 150, such that the dielectric material has a thickness in a range of from 80 nm to 90 nm.

In one or more unillustrated embodiments, the formation of the semiconductor device, e.g., GAA, continues according to traditional procedures with nanosheet release and replacement metal gate formation. Specifically, in one or more unillustrated embodiments, the plurality of semiconductor material layers 104 are selectively etched between the plurality of horizontal channel layers 106 in the superlattice structure 101. For example, where the superlattice structure 101 is composed of silicon (Si) layers and silicon germanium (SiGe) layers, the silicon germanium (SiGe) is selectively etched to form channel nanowires. The plurality of semiconductor material layers 104, for example silicon germanium (SiGe), may be removed using any well-known etchant that is selective to the plurality of horizontal channel layers 106 where the etchant etches the plurality of semiconductor material layers 104 at a significantly higher rate than the plurality of horizontal channel layers 106. In some embodiments, a selective dry etch or wet etch process may be used. In some embodiments, where the plurality of horizontal channel layers 106 are silicon (Si) and the plurality of semiconductor material layers 104 are silicon germanium (SiGe), the layers of silicon germanium may be selectively removed using a wet etchant such as, but not limited to aqueous carboxylic acid/nitric acid/HF solution and aqueous citric acid/nitric acid/HF solution. The removal of the plurality of semiconductor material layers 104 leaves voids between the plurality of horizontal channel layers 106. The voids between the plurality of horizontal channel layers 106 have a thickness of about 3 nm to about 20 nm. The remaining horizontal channel layers 106 form a vertical array of channel nanowires that are coupled to the source/drain 121*a*, 121*b* regions. The channel nanowires run parallel to the top surface of the substrate 102 and are aligned with each other to form a single column of channel nanowires.

In one or more unillustrated embodiments, a high-k dielectric is formed. The high-k dielectric can be any suitable high-k dielectric material deposited by any suitable deposition technique known to the skilled artisan. The high-k dielectric of some embodiments comprises hafnium oxide. In some embodiments, a conductive material such as titanium nitride (TiN), tungsten (W), cobalt (Co), aluminum (Al), or the like is deposited on the high-k dielectric to form the replacement metal gate. The conductive material may be formed using any suitable deposition process such as, but not limited to, atomic layer deposition (ALD) in order to ensure the formation of a layer having a uniform thickness around each of the plurality of channel layers.

In one or more unillustrated embodiments, a drain contact to transistor (CT) and contact to gate (CG) are formed. Additionally, the metal (M0) line and metal (M1) line is formed and electrically connected to the via (V1).

Figure 4F:
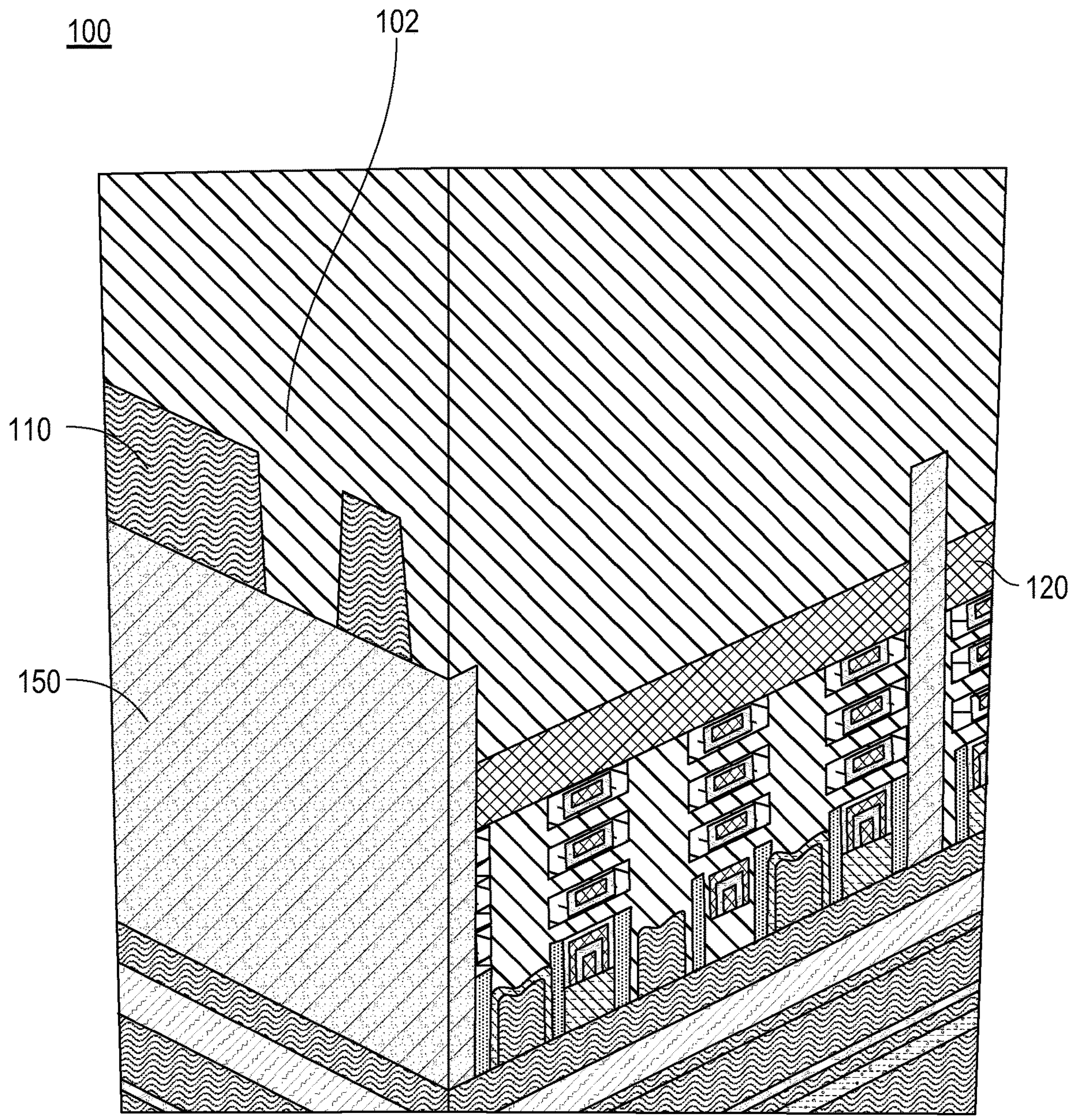

With reference to FIG. 4F, at operation 64 of FIG. 1C, the device 100 is rotated or flipped 180 degrees, such that the substrate 102 is now at the top of the illustration.

Figure 4G:
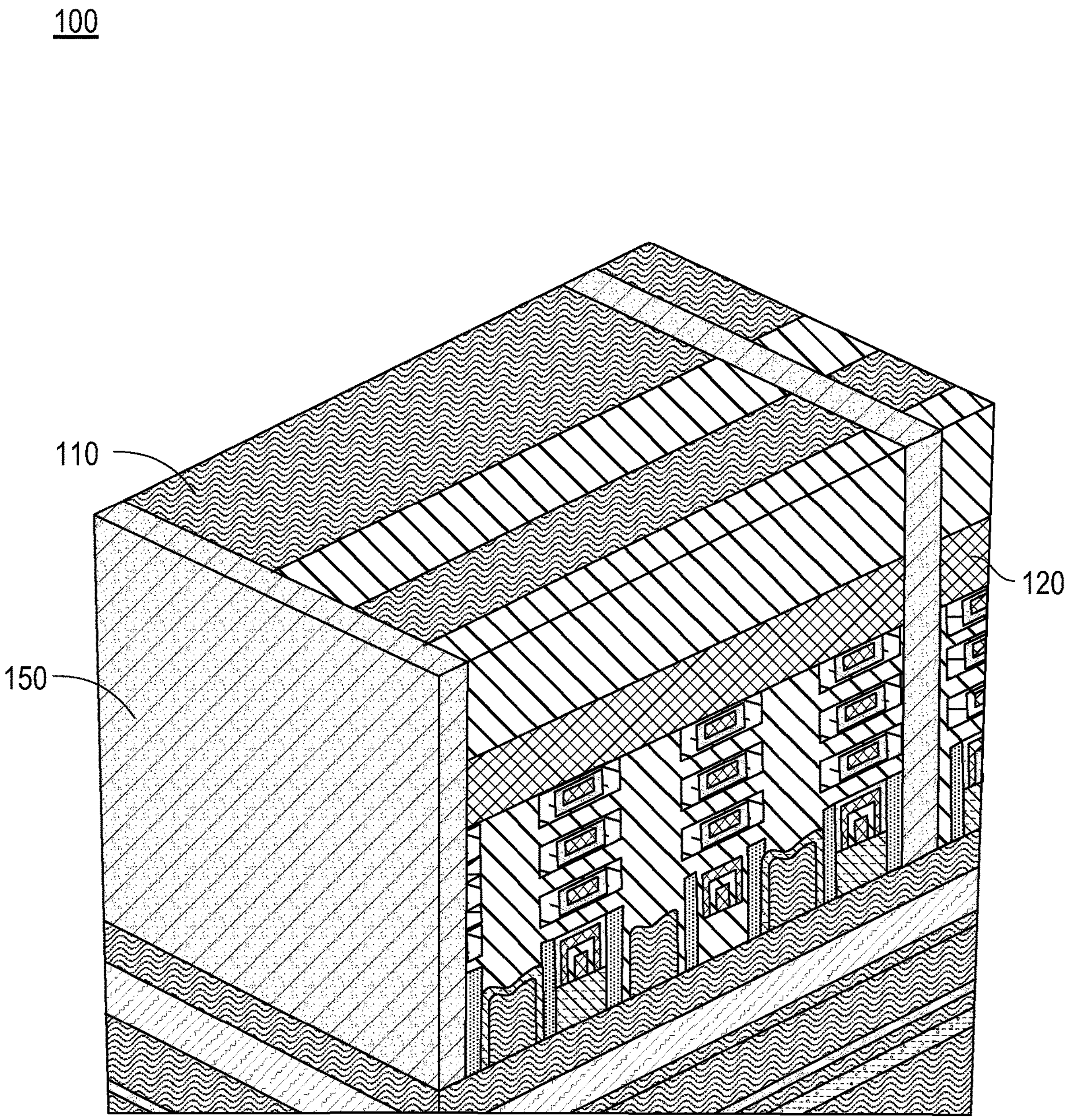

With reference to FIG. 1C and FIG. 4G, at operation 64, the device 100 is planarized, stopping at the mixed diffusion break fill material 150. The planarization may be any suitable planarization process known to the skill artisan including, but not limited to, chemical mechanical planarization (CMP). In some embodiments, an advanced chemical mechanical planarization (CMP) process with the mixed diffusion break fill material 150 as an etch stop layer for backside wafer polishing to realize a backside power rail. Advanced CMP uses end-point detection (EDP). Precision process control and EPD are required to minimize dishing and erosion in the structure. Traditional CMP does not use end-point detection (EDP).

Figure 4H:
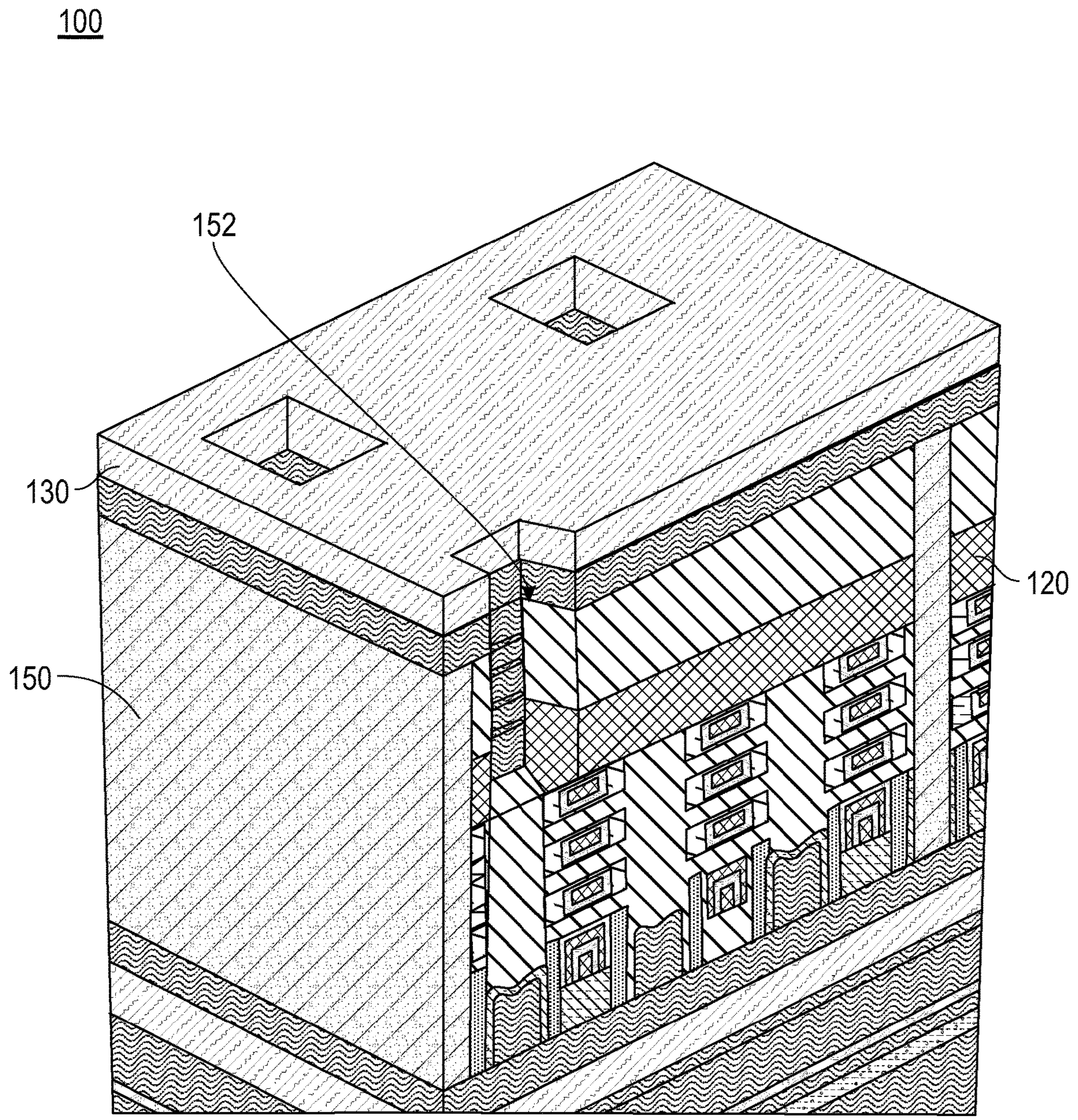

Referring to FIG. 4H, at operation 66, an interlayer dielectric material 130 is deposited on the backside. The interlayer dielectric material 130 may be deposited by any suitable means known to one of skill in the art. The interlayer dielectric material 130 may comprise any suitable material known to the skilled artisan. In one or more embodiments, the interlayer dielectric material 130 comprises one or more of silicon nitride (SiN), carbide, or boron carbide, to allow high aspect ratio etch and metallization.

As illustrated in FIG. 4H, at operation 68 of FIG. 1C, in one or more embodiments, the backside via 152 is patterned. The via 152 may be formed by any suitable means known to the skilled artisan. In one or more embodiments, the via 152 may be formed by patterning and etching the interlayer dielectric material 130. When the via 152 is patterned, it extends from a top surface of the interlayer dielectric material 130 to the bottom dielectric isolation (BDI) layer 120. In one or more embodiments, the bottom dielectric isolation (BDI) layer 120, thus, serves as an etch stop layer. In some embodiments, the aspect ratio of the via 152 is greater than or equal to about 5:1, about 10:1, about 15:1, about 20:1, about 25:1, about 30:1, about 35:1 or about 40:1.

Figure 4I:
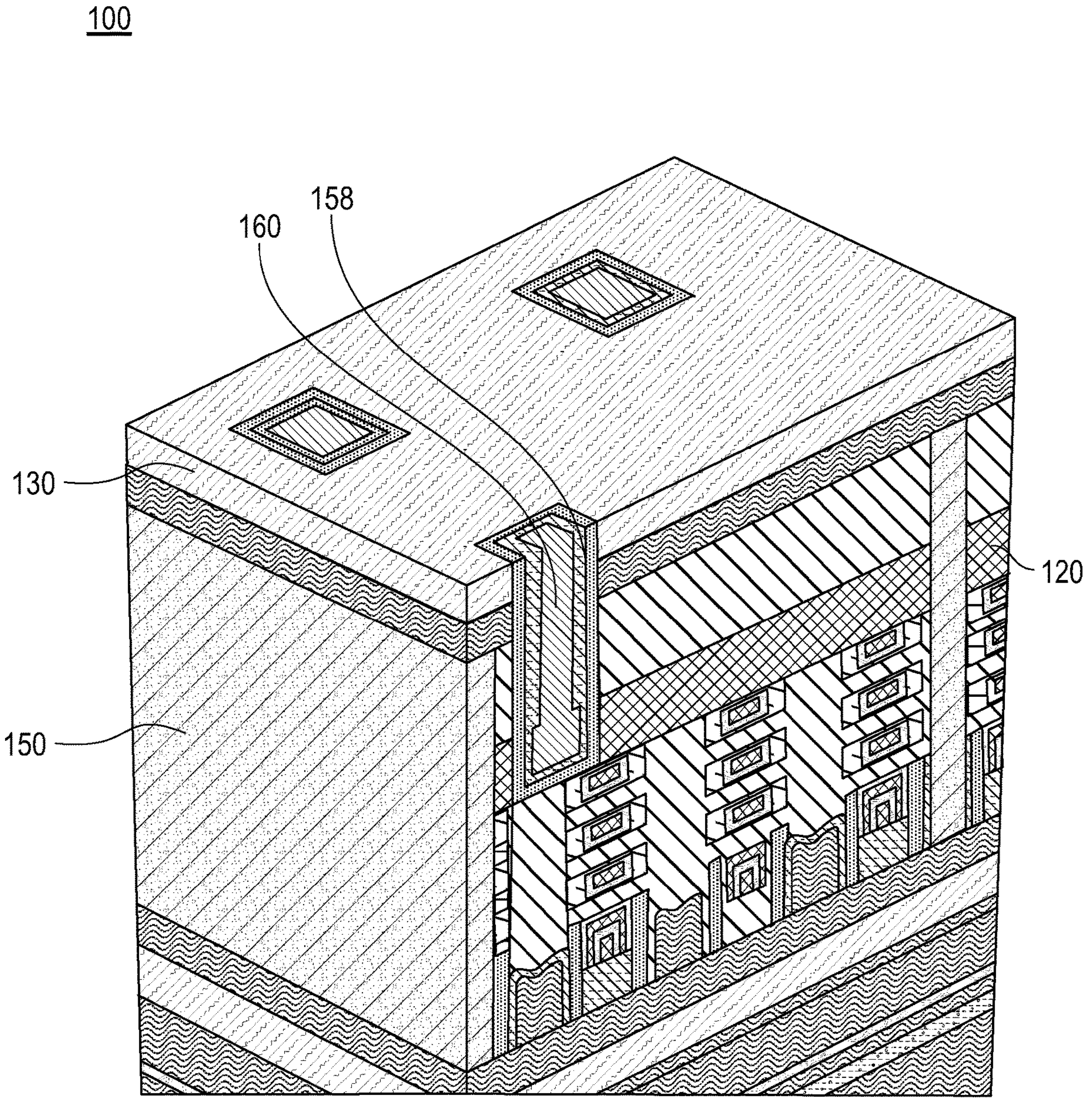

At operation 70 of FIG. 1C, as illustrated in FIG. 4I, the device 100 is silicidated and a barrier layer 158 is deposited in the via 152. The barrier layer 158 may comprise any suitable material known to the skilled artisan. In some embodiments, the barrier layer 158 comprises titanium nitride (TiN) or tantalum nitride (TaN). At operation 72, a metal 160 is deposited in the via 152 on the barrier layer 158. The metal 160 may comprise any suitable metal known to the skilled artisan. In one or more embodiments, the metal 160 is selected from one or more of tungsten (W), molybdenum (Mo), cobalt (Co), copper (Cu), ruthenium (Ru), and the like.

Figure 4J:
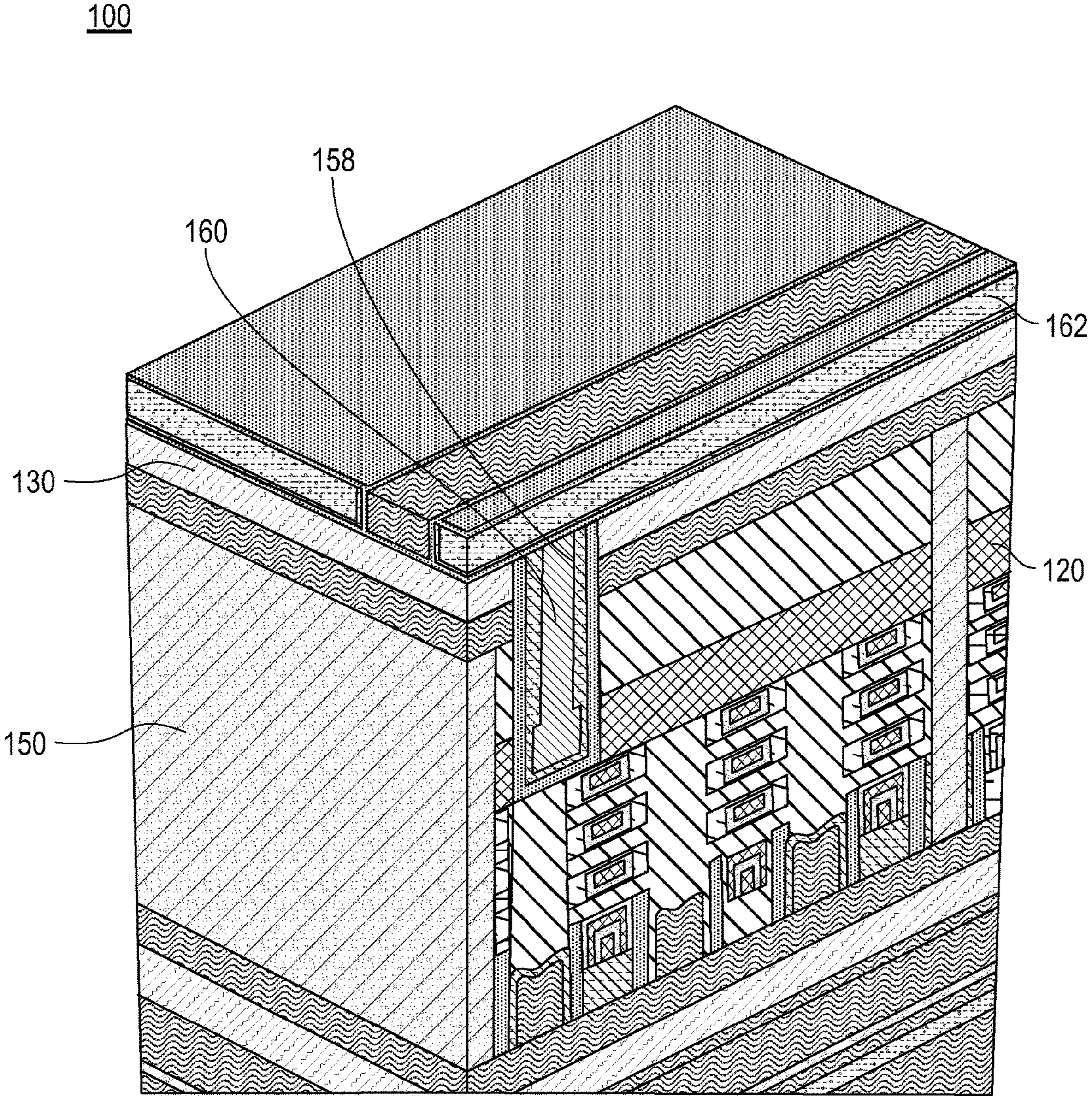

With reference to FIG. 1C and FIG. 4J, at operation 74, the backside metal line (M0) 162 is formed. Without intending to be bound by theory, it is thought that locating the power rail on the backside allows for a gain in the area of the cell in a range of from 20% to 30%.

Figure 5:
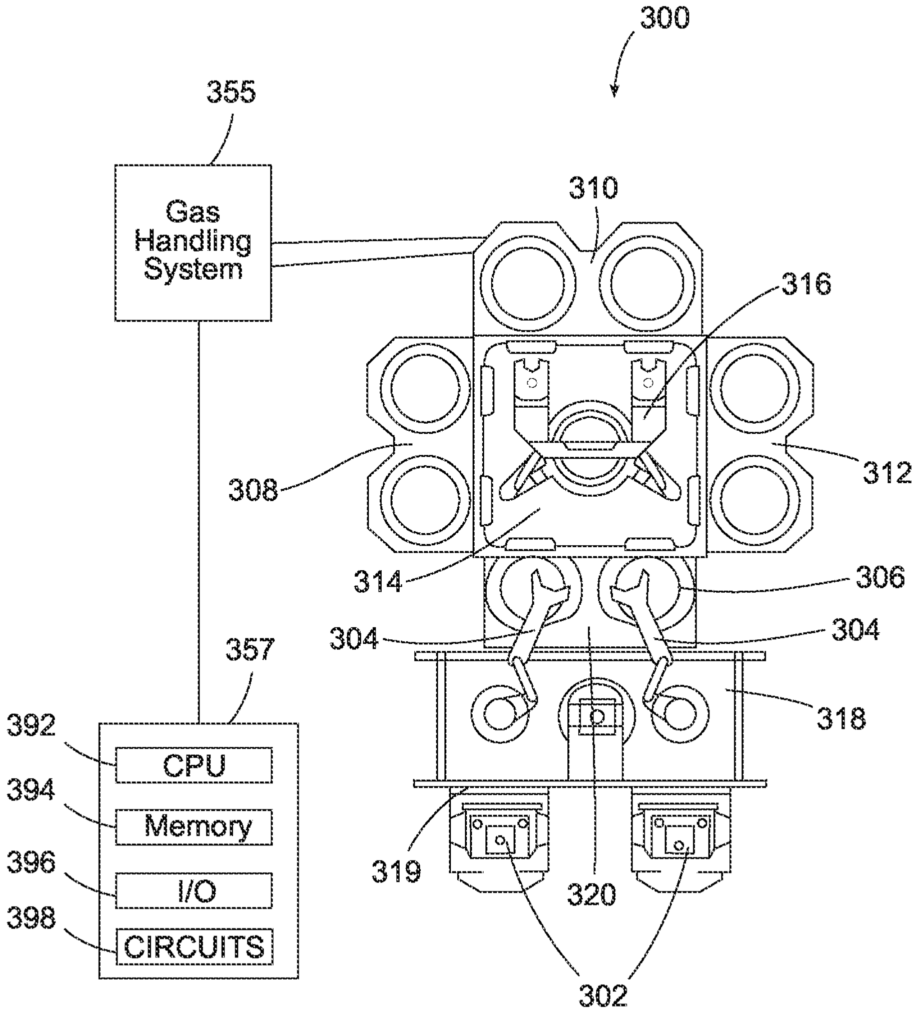
FIG. 5 illustrates a cluster tool according to one or more embodiments.

Additional embodiments of the disclosure are directed to cluster tools 300 for the formation of the GAA devices and methods described, as shown in FIG. 5. A variety of multi-processing platforms may be utilized. The cluster tool 300 includes at least one central transfer station 314 with a plurality of sides. A robot 316 is positioned within the central transfer station 314 and is configured to move a robot blade and a wafer to each of the plurality of sides.

The cluster tool 300 comprises a plurality of processing chambers 308, 310, and 312, also referred to as process stations, connected to the central transfer station. The various processing chambers provide separate processing regions isolated from adjacent process stations. The processing chamber can be any suitable chamber including, but not limited to, a pre-clean chamber, a deposition chamber, an annealing chamber, an etching chamber, and the like. The particular arrangement of process chambers and components can be varied depending on the cluster tool and should not be taken as limiting the scope of the disclosure.

In the embodiment shown in FIG. 5, a factory interface 318 is connected to a front of the cluster tool 300. The factory interface 318 includes chambers 302 for loading and unloading on a front 319 of the factory interface 318.

The size and shape of the loading chamber and unloading chamber 302 can vary depending on, for example, the substrates being processed in the cluster tool 300. In the embodiment shown, the loading chamber and unloading chamber 302 are sized to hold a wafer cassette with a plurality of wafers positioned within the cassette.

Robots 304 are within the factory interface 318 and can move between the loading and unloading chambers 302. The robots 304 are capable of transferring a wafer from a cassette in the loading chamber 302 through the factory interface 318 to load lock chamber 320. The robots 304 are also capable of transferring a wafer from the load lock chamber 320 through the factory interface 318 to a cassette in the unloading chamber 302.

The robot 316 of some embodiments is a multi-arm robot capable of independently moving more than one wafer at a time. The robot 316 is configured to move wafers between the chambers around the transfer chamber 314. Individual wafers are carried upon a wafer transport blade that is located at a distal end of the first robotic mechanism.

A system controller 357 is in communication with the robot 316, and a plurality of processing chambers 308, 310 and 312. The system controller 357 can be any suitable component that can control the processing chambers and robots. For example, the system controller 357 can be a computer including a central processing unit (CPU) 392, memory 394, inputs/outputs 396, suitable circuits 398, and storage.

Processes may generally be stored in the memory of the system controller 357 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In some embodiments, the system controller 357 has a configuration to control the rapid thermal processing chamber to crystallize the template material.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising a template deposition chamber and a template crystallization chamber; and a controller connected to the central transfer station and the plurality of process stations, the controller configured to activate the robot to move the wafer between process stations, and to control a process occurring in each of the process stations.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods, and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a semiconductor device, the method comprising:

forming a gate structure on a superlattice structure, the superlattice structure on a top surface of a shallow trench isolation on a substrate, the superlattice structure comprising a plurality of horizontal channel layers and a corresponding plurality of semiconductor material layers alternatingly arranged in a plurality of stacked pairs;

forming a plurality of source trenches and a plurality of drain trenches adjacent to the superlattice structure on the substrate;

depositing a bottom dielectric isolation layer in the plurality of source trenches and the plurality of drain trenches;

forming a resist on a top surface of the gate structure;

patterning the resist to expose the superlattice structure and the bottom dielectric isolation layer, and form a diffusion break opening, the diffusion break opening extending from the top surface of the gate structure to the shallow trench isolation;

depositing a diffusion break material in the diffusion break opening, the diffusion break material comprising both a dielectric material and a metal;

planarizing the semiconductor device;

etching to form a plurality of via openings extending to the bottom dielectric isolation layer; and depositing a metal in the plurality of via openings to form a plurality of vias.

2. The method of claim 1, wherein the diffusion break opening comprises a single diffusion break opening.

3. The method of claim 1, wherein the diffusion break opening comprises both a single diffusion break opening and a double diffusion break opening.

4. The method of claim 1, wherein the dielectric material has a thickness in a range of from 80 nm to 90 nm and wherein the metal has a thickness in a range of from 10 nm to 50 nm.

5. The method of claim 1, further comprising expanding at least one of the plurality of source trenches and at least one of the plurality of drain trenches.

6. The method of claim 5, wherein expanding comprises lateral etching.

7. The method of claim 1, wherein the plurality of semiconductor material layers comprise silicon germanium (SiGe) and the plurality of horizontal channel layers comprise silicon (Si).

8. The method of claim 1, wherein the plurality of semiconductor material layers comprise silicon (Si) and the plurality of horizontal channel layers comprise silicon germanium (SiGe).

9. The method of claim 1, wherein the gate structure comprises one or more of tungsten (W), cobalt (Co), molybdenum (Mo), ruthenium (Ru), titanium nitride (TiN), tantalum nitride (TaN), titanium aluminum (TiAl), and n-doped polysilicon.

10. The method of claim 1, wherein the method is performed in a processing chamber without breaking vacuum.

11. A method of forming a semiconductor device, the method comprising:

forming a plurality of source trenches and a plurality of drain trenches adjacent to a superlattice structure on a substrate, the superlattice structure comprising a plurality of horizontal channel layers and a corresponding plurality of semiconductor material layers alternatingly arranged in a plurality of stacked pairs;

expanding at least one of the plurality of source trenches and at least one of the plurality of drain trenches to form a source cavity and a drain cavity;

depositing a bottom isolation dielectric layer in the source cavity and in the drain cavity;

forming a resist on a gate structure, the gate structure adjacent the superlattice structure on the substrate;

patterning the resist to form at least one diffusion break opening;

depositing a diffusion break material in the at least one diffusion break opening, the diffusion break material comprising both a dielectric material and a metal;

rotating the semiconductor device 180 degrees;

planarizing the semiconductor device;

forming a backside power rail via in the substrate to the bottom dielectric isolation layer; and depositing a metal in the backside power rail via.

12. The method of claim 11, wherein the at least one diffusion break opening comprises a single diffusion break opening.

13. The method of claim 11, wherein the at least one diffusion break opening comprises both a single diffusion break opening and a double diffusion break opening.

14. The method of claim 11, wherein the dielectric material has a thickness in a range of from 80 nm to 90 nm and wherein the metal has a thickness in a range of from 10 nm to 50 nm.

15. The method of claim 11, expanding at least one of the plurality of source trenches and at least one of the plurality of drain trenches comprises lateral etching.

16. The method of claim 11, wherein the plurality of semiconductor material layers comprise silicon germanium (SiGe) and the plurality of horizontal channel layers comprise silicon (Si), or wherein the plurality of semiconductor material layers comprise silicon (Si) and the plurality of horizontal channel layers comprise silicon germanium (SiGe).

17. The method of claim 11, wherein the gate structure comprises one or more of tungsten (W), cobalt (Co), molybdenum (Mo), ruthenium (Ru), titanium nitride (TiN), tantalum nitride (TaN), titanium aluminum (TiAl), and n-doped polysilicon.

18. The method of claim 11, wherein the method is performed in a processing chamber without breaking vacuum.

* * * * *